(12) United States Patent
Kumomi et al.

(10) Patent No.: US 7,473,621 B2
(45) Date of Patent: Jan. 6, 2009

(54) PRODUCING METHOD FOR CRYSTALLINE THIN FILM

(75) Inventors: Hideya Kumomi, Yokohama (JP); Takeo Yamazaki, Yokohama (JP); Masatoshi Watanabe, Tsehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 327 days.

(21) Appl. No.: 10/533,091

(22) PCT Filed: Nov. 26, 2003

(86) PCT No.: PCT/JP03/15072

§ 371 (c)(1),
(2), (4) Date: Apr. 28, 2005

(87) PCT Pub. No.: WO2004/049412

PCT Pub. Date: Jun. 10, 2004

(65) Prior Publication Data

US 2006/0024858 A1    Feb. 2, 2006

(30) Foreign Application Priority Data

Nov. 27, 2002 (JP) ............................. 2002-343358
Nov. 27, 2002 (JP) ............................. 2002-343359
Nov. 29, 2002 (JP) ............................. 2002-348004
Nov. 29, 2002 (JP) ............................. 2002-348005
Dec. 10, 2002 (JP) ............................. 2002-358163

(51) Int. Cl.
*H01L 21/20* (2006.01)

(52) U.S. Cl. .................. 438/479; 438/166; 438/486; 438/487; 257/E21.09

(58) Field of Classification Search ........ 438/479, 438/486, 487, 166, 89; 257/E21.09
See application file for complete search history.

(56) References Cited

U.S. PATENT DOCUMENTS 4,564,403 A * 1/1986 Hayafuji et al. ............. 117/43

(Continued)

FOREIGN PATENT DOCUMENTS

EP    0472970    3/1992

(Continued)

OTHER PUBLICATIONS

Kumomi, et al. "Selective Nucleation-based Epitaxy (SENTAXY): A novel Approach for Thin Film Formation"; JPN J. Appl. Phys., vol. 36 pp. 1383-1388 (1997).

(Continued)

*Primary Examiner*—Alexander G Ghyka
*Assistant Examiner*—Angel Roman
(74) *Attorney, Agent, or Firm*—Fitzpatrick, Cella, Harper & Scinto

(57) ABSTRACT

A method for producing a crystalline film by melting and resolidifying a film, characterized in preparing a film having a specific region and obtained either by (A) a step of forming a film in which a "specific region" and an "region continuous to a periphery of the specific region and different in thickness from the specific region" co-exist, or by (B) a step of irradiating a film with an elecrtromagnetic wave or particles having a mass in mutually different conditions between a specific region and a peripheral region thereof, and melting and resolidifying at least a part of the film. As the spatial position of the specific region can be exactly and easily controlled, it is possible to obtain a crystalline film in which a crystal grain is formed in a desired position.

19 Claims, 18 Drawing Sheets

U.S. PATENT DOCUMENTS

| | | | |
|---|---|---|---|
| 4,670,088 A | 6/1987 | Tsaur et al. | 156/617 |
| 5,021,119 A | 6/1991 | Fan et al. | |
| 5,130,103 A | 7/1992 | Yamagata et al. | 428/209 |
| 5,207,863 A | 5/1993 | Kumomi | 156/603 |
| 5,290,712 A | 3/1994 | Sato et al. | 437/24 |
| 5,318,661 A | 6/1994 | Kumomi et al. | |
| 5,453,153 A | 9/1995 | Fan et al. | |
| 5,496,768 A | 3/1996 | Kudo | 437/174 |
| 5,683,935 A | 11/1997 | Miyamoto et al. | |
| 5,723,348 A | 3/1998 | Kumomi et al. | 437/23 |
| 5,736,438 A * | 4/1998 | Nishimura et al. | 438/166 |
| 6,326,286 B1 | 12/2001 | Park et al. | |
| 6,432,758 B1 * | 8/2002 | Cheng et al. | 438/166 |
| 6,756,614 B2 * | 6/2004 | Hatano et al. | 257/192 |
| 7,115,487 B2 | 10/2006 | Kumoni et al. | 438/486 |
| 2003/0003766 A1 | 1/2003 | Kumomi et al. | |

FOREIGN PATENT DOCUMENTS

| | | |
|---|---|---|
| EP | 1262578 | 12/2002 |
| GB | 2338342 | 12/1999 |
| JP | 6-333827 A | 12/1994 |
| JP | 8-8197 | 1/1996 |
| JP | 8-236443 A | 9/1996 |
| JP | 2001-210828 A | 8/2001 |
| WO | WO 89/04550 | 5/1989 |

OTHER PUBLICATIONS

Kumomi, et al. "Fundamentals for the Formation and Structure Control of Thin Films: Nucleation, Growth, Solid-state Transformations"; Handbook of Thin Film Materials, vol. 7, Ch. 6, pp. 319-373 (2002).

Hatano, et al. "Excimer Laser-induced Temperature Field in Melting and Resolidification of Silicon Thin Films"; J. Appl. Phys., vol. 87, No. 1, pp. 36-43 (2000).

Van der Wilt, et al. "Formation of Location-controlled Crystalline Islands Using Substrate-embedded Seeds in Excimer-laser Crystallization of Silicon Films"; Appl. Phys. Lett, vol. 79, No. 12, pp. 1819-1821 (2001).

Kurlyama et al., "Comprehensive Study . . . Thin Film Transistors", Jpn. J. Appl. Phys., vol. 33, (Part 1, No. 10) (1994) 5657-5662.

Van Der Wilt, "Grain Location . . . Thin Silicon Film", Phys. Stat. Solidi vol. 166 No. 2, 619-626 (Apr. 1998).

Kumomi et al., "Manipulation of nucleation sites . . . Si Crystallization", Appl. Phys. Ltts., vol. 59, No. 27, 3565-3567 (Dec. 1999).

Hatano et al.; "In situ and ex situ . . . laser annealing", J. Non-Cryst. Solids, vol. 266-269, 654-658 (May 2000).

Patent Abstracts of Japan, vol. 0080, No. 52 (C-213) Mar. 1984 for JP 58-208297.

Patent Abstracts of Japan, vol. 0172, No. 53 (E-1367) May 1993 for JP04-373171.

Patent Abstracts of Japan, vol. 0164, No. 99 (E-1290) Oct. 1992 for JP04-184918.

English translation of JP 6-333827.

English translation of JP 2001-210828.

* cited by examiner

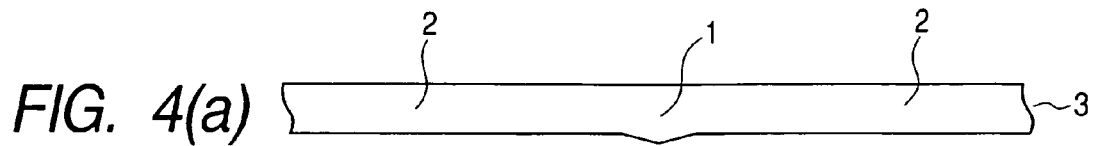
FIG. 4(a)
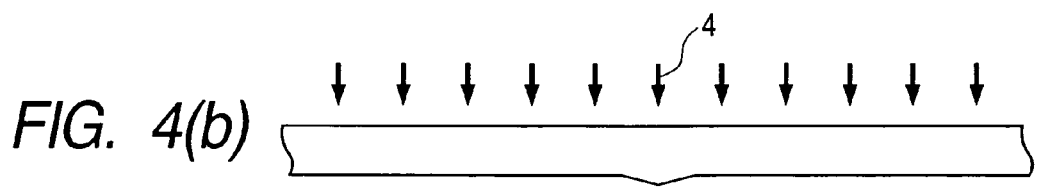
FIG. 4(b)
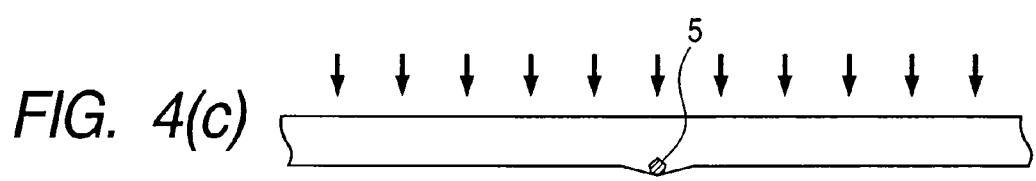
FIG. 4(c)
FIG. 4(d)
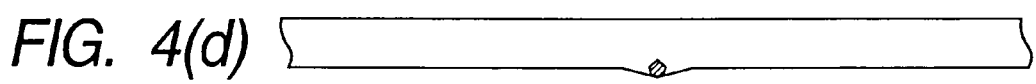
FIG. 4(e)
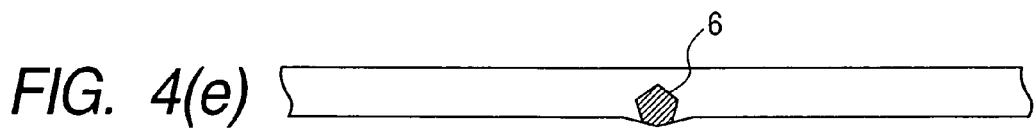
FIG. 4(f)
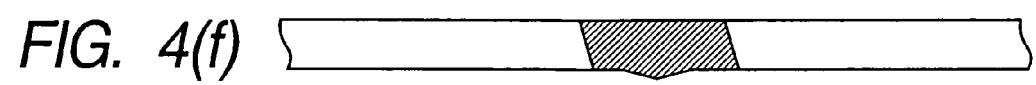
FIG. 4(g)
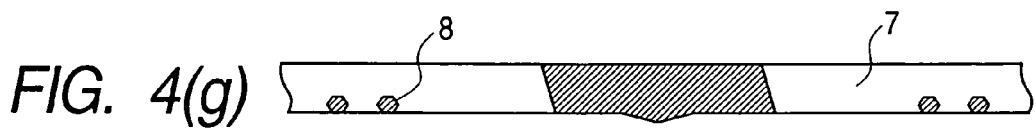
FIG. 4(h)
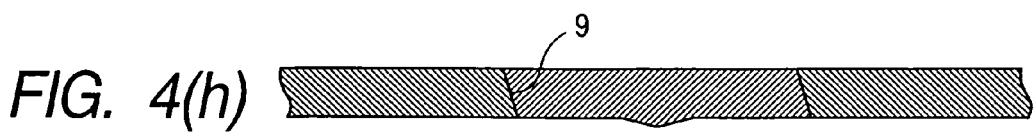

PRODUCING METHOD FOR CRYSTALLINE THIN FILM

TECHNICAL FIELD

The present invention relates to a crystalline thin film for forming a drive circuit or the like of a flat panel display and a producing method therefor.

BACKGROUND ART

In a flat panel display represented by a liquid crystal display, a higher definition, a higher velocity and a larger number of gradation levels in the image display have been achieved by a monolithic formation of a pixel driving circuit on the panel and by improvement in the performance of such a circuit. The panel of simple matrix drive system has progressed to the panel of active matrix drive system employing a switching transistor for each pixel. Also the shift register circuit employed in the active matrix drive system is formed in the peripheral region of the same panel. Thus, there are present full-color, high-definition liquid crystal displays that can even display moving images.

Realization of such a monolithic formation including also a peripheral drive circuit with a practical manufacturing cost owes greatly to a technology for forming a polycrystalline silicon film excellent in electrical characteristics on an inexpensive glass substrate. In this technology, an amorphous silicon film deposited on a glass substrate is melted and re-solidified with short pulse light in the ultraviolet region such as excimer laser to obtain a polycrystalline silicon film while the glass substrate is maintained at a low temperature. In comparison with a polycrystalline film obtained by solid-phase crystallization of the same starting amorphous silicon film, crystal grains obtained by the melting and resolidification method have less crystalline defects in the interior, whereby a thin film transistor utilizing such a film as the active area shows high carrier mobility. Therefore, even a polycrystalline silicon film of submicron average grain size allows production of a monolithic circuit for active matrix drive, of which performance is sufficient for a liquid crystal display of several inches in diagonal and a resolution of about 100 ppi at most.

Performance required for an active element such as a transistor is recently increasingly higher not only in a flat panel display but also in a semiconductor device requiring a high spatial uniformity, such as an image sensor, a magnetic recording apparatus, an information processing apparatus etc.

However, the thin film transistor utilizing the current melted and resolidified polycrystalline film does not have sufficient performance for the next generation liquid crystal display of widescreen or high-definition. Also such a poly-crystalline silicon film is deficient in performance for use as, for example, a drive circuit element for a plasma display or an electroluminescence display requiring a higher voltage or a larger drive current than in the liquid crystal display, or a high-velocity drive circuit element of a wide screened X-ray image sensor, of which future development is expected. Even though the defect density within the crystal grains is low, the polycrystalline silicon film with an average grain size in sub-micron order cannot provide such high-performance devices. This is because the active area of an element of the order of micron includes many crystalline boundaries constituting significant hindrance to charge transfer.

The present inventors has proposed a general theory for reducing simultaneously the density of crystal boundaries and spatial dispersion thereof in a polycrystalline film as follows:

H. Kumomi and T. Yonehara, Jpn. J. Appl. Phys. 36, 1383 (1997); and

H. Kumomi and F. G. Shi, "Handbook of Thin Films Materials" Volume 1, Chapter 6, "Nucleation, Gorwth and Crystallization of Thin Films" edited by H. S. Nalwa (Academic Press, New York, 2001).

This is an idea of controlling the position of formation of crystal grains to control the position of crystal boundary and the grain size distribution, and it has been verified in chemical vapor deposition of a polycrystalline film or a solid phase crystallization of a thin film.

There have been studies of utilizing the same idea in the melting-resolidification formation of a crystalline film. Among these, the most successful one is of Wilt et al., as reported in:

P. Ch. van der Wilt, B. D. van Dijk, G. J. Bertsev, R. Ishihara, and C. I. M. Beenakker, Appl. Phys. Lett., Vol. 79, No. 12, 1819(2001); and R. Ishihara, P. Ch. van der Wilt, B. D. van Dijk, A. Burtsev, J. W. Metselaar and C. I. Beenakker, Digest of Technical Papers, AM-LCD 02, 53(The Japan Society of Applied Physics, 2002).

FIGS. 21(a) to 21(f) are cross sectional views showing an outline and a function of this process.

First, they formed a fine hole 2 of a diameter of 0.1 μm or less and a depth of about 1 μm from the surface of a silicon oxide layer 1 on a silicon monocrystalline substrate, then formed thereon an amorphous silicon film 3 of a thickness of 90 to 272 nm so as to fill the hole, and irradiated it with excimer laser 4 for completely fusing the film 3 except for the inside of the hole 2 [FIG. 21(a)]. When the amorphous silicon filling the hole 2 is not completely melted, there remains a group 5 of many crystal grains of a grain size of 20 to 50 nm, formed by an explosive crystallization in solid phase prior to the fusing [FIG. 21(b)]. Even if complete melting takes place also in the hole 2, it is considered that the heat due to the excimer laser irradiation is dissipated mainly to the silicon substrate whereby cooling proceeds at the bottom of the hole 2 causing crystal nucleation from the molten phase. In either case, with the proceeding of cooling from the bottom of the hole 2 toward the surface of the silicon film 3, crystal grains of group 5 present at the solid-liquid interface grow upward in the hole 2 [FIG. 21(c)]. In this state, part of the crystal grains loose a margin for growth for example because of an anisotropy in the growing velocity, whereby crystal grains capable of continuing upward growth are culled ("grain filtering") [FIG. 21(c)]. By the time the crystal growth reaches the aperture of the hole 2, the number of the crystal grains capable of continuing growth is reduced to one, and such one crystal grain emerges from the hole 2 and grows into the amorphous silicon film 3 forming a crystal grain 6 [FIG. 21(d)]. After the growing front of the crystal grain 6 reached the surface of the amorphous silicon film 3, the growth is limited to a planar direction of the film, i.e., lateral growth [FIG. 21(e)]. When the cooling of the entire system proceeds, and the degree of supercooling in an unsolidified region 7 of the silicon film 3 becomes large enough, crystal nuclei 8 are generated at a high rate and a high concentration from the molten phase [FIG. 21(e)], and they collide with the crystal grain 6 to form a grain boundary 9 finishing the solidification [FIG. 21(f)]. In this manner the positions of the crystal grain 6 and the grain boundary 9 thereof are controlled by the position of the hole 2.

In the above-mentioned documents, Ishihara et al. fabricated MOS thin film transistor elements having a gate area in the crystal grain 6 of which position was controlled by the aforementioned method, and evaluated characteristics thereof and fluctuation therein. According to the report, the elements showed excellent characteristics in average close to those of elements on a monocrystalline silicon substrate, but a fluctuation among plural elements in the characteristics was far inferior to that of the elements provided on the monocrystalline silicon substrate, falling far short of the expectation.

In the above-mentioned reports, the large fluctuation in the characteristics among plural elements is resulted, in fact, from the incomplete position control of the crystal grain. More specifically, it results from a fact that the crystal grain 6 growing laterally from the aperture of the fine hole 2 is not necessary constituted of a single crystal grain but includes plural crystal grains, thus often containing a crystal grain boundary therein, and that the number of such a crystal grain boundary varies from 0 to a large number.

In the method explained in FIGS. 21(*a*) to 21(*f*), among the crystals of the crystal grain group 6 existing in the bottom of the hole 2, crystal habits, facet regions and orientations along the hole 2 of those at the solid-liquid interface of those at the solid-liquid interface are random. The "grain filtering" based on a preferential growth does not necessarily lead to selection of a single crystal grain, and often plural crystal grains simultaneously reach the aperture of the hole 2.

Also it is expected to increase the selection yield of a single crystal grain by increasing the depth of the hole 2 to increase a "grain filtering" length. The method explained in FIGS. 21(*a*) to 21(*f*) is so designed that, utilizing a wide temperature distribution generated along the depth of the hole 2, a complete melting state is attained at the aperture of the hole 2 where the temperature becomes high at the maximum melting of the amorphous silicon film, while an unmelted state is attained at the bottom of the hole 2 where the temperature is low. Since the temperature distribution is continuous, there always exist, between the aperture and the bottom of the hole 2, a near complete melting region and a partial melt region between the complete melting state and the unmelted state. Thus, the crystal grains existing in the hole 2 are present not only at the bottom of the hole 2 but also distributed widely with a density gradient decreasing toward the aperture of the hole 2. Therefore, mere deepening of the hole 2 will not increase the length of "grain filtering".

On the other hand, the "grain filtering" in the hole 2 depends significantly on the hole diameter. For example, increased diameter increases the probability of plural crystal grains reaching the hole aperture, so that the selection yield of a single crystal grain becomes low. Smaller diameter will result in high selection yield. In principle, if the diameter of the hole 2 is smaller than the size of the smallest crystal grain of the crystal grain group 5, only one crystal grain comes into contact with the solid-liquid interface from the beginning, which enables single crystal grain selection securely. In practice, however, when the hole 2 is made in such a small size, the average grain size of the crystal grain group 5 is reduced at the same time, and an effective melting point is lowered by a capillary effect. Thus it is difficult to retain the crystal grain group 5 in an unmelted state. Also with the microfabrication technology even up to a near future, it is extremely difficult to form a fine hole of several tens of nanometers or less with a depth of 1 μm. Furthermore, even when such a fine hole can be actually formed, it is also difficult to fill it with amorphous silicon.

Also in consideration of the present level of the microfabrication technology, even with the dimension of the hole 2 explained in FIGS. 21(*a*) to 21(*f*), it is difficult to form a number of fine holes of such a high aspect ratio with a high precision over a wide region. Fluctuations in the dimension and the shape of the hole 2 are directly reflected in the fluctuation in the number of the crystal grains reaching the aperture of the hole 2. The present inventors thinks that this fact is possibly a main cause of the fluctuation in the element characteristics in the aforementioned reports.

As explained above, the aforementioned technology is an excellent idea cleverly combining the temperature distribution in the direction of depth of the fine hole 2 and the "grain filtering" phenomenon, but it is difficult to increase the selection yield of a single crystal grain for practical use by mere optimization of the conditions in view of the principle and the limitation of the manufacturing technology.

An object of the present invention is to realize a novel method free from the inherent difficulties of the prior art and to realize a novel method for precisely controlling a crystal grain position in the production of a crystalline film by melting and resolidification, applicable to a glass substrate. It is also an object to provide a crystalline thin film in which the crystal grain position is highly controlled by such a producing method, and to provide an element, a circuit and an apparatus of a high performance utilizing such a thin film.

DISCLOSURE OF THE INVENTION

The present invention is a method for producing a crystalline thin film by melting and resolidifying a thin film, characterized in preparing a thin film either through (A) a step of forming a film in which a "specific region" and an "region continuous to a periphery of the specific region and different in thickness from the specific region" are co-existing, or (B) a step of irradiating a film having a specific region and a peripheral region thereof with an elecrtromagnetic wave or particles having a mass under conditions different between the specific region and the peripheral region, and melting and resolidifying at least a part of the film.

The step (A) is preferably a step of forming a film in which the specific region has a larger thickness than in a peripheral region thereof.

It is also preferable that, in a maximum melted state of the film in the course of melting and resolidification, a single crystal grain or single crystalline cluster remains unmelted in the specific region, while the peripheral region thereof is completely melted.

Also in the course of melting and resolidifying at least a part of the film subjected to the step (B), it is preferred that crystal grains or crystalline clusters of a desired number grow in the specific region. Such crystal grains or crystalline clusters can be crystal grains or crystalline clusters not melted at the maximum melting of the film, or those nucleated from a molten phase.

In the process of melting and resolidification of the film, by taking Tc as a melting point of a bulk crystal and ΔTc as a degree of supercooling causing a spontaneous nucleation from a molten phase, it is also a feature of the present invention to form specific regions with a predetermined interval, at the resolidification of the film, in such a manner that a portion between two specific regions within a predetermined interval assumes a temperature of Tc−ΔTc or higher at a time when the degree of supercooling of an unsolidified region reaches ΔTc. Also the present invention is a method for producing a crystalline film by melting and resolidifying a film with plural heating means. Also the present invention is a method for producing a crystalline film, including a step of giving a constant heat not changing with time, to a film in which regions of mutually different states co-exist in continuation thereby heating to a temperature lower than a melting point, a step of giving a heat changing with time thereby heating and melting the heated film, and a step of resolidifying the film.

In the following, the method of melting and resolidifying the film through the step (A) is called a first crystalline film of the invention and a producing method thereof, the method of melting and resolidifying the film through the step (B) is called a second crystalline film of the invention and a producing method thereof, the method of setting the interval of the specific regions as explained above is called a third producing method of crystalline film of the invention, and the method of melting and resolidifying the film with plural heating means is called a fourth producing method of crystalline film of the invention.

BRIEF DESCRIPTION OF THE DRAWINGS

FIGS. 4(a), 4(b), 4(c), 4(d), 4(e), 4(f), 4(g) and 4(h) show a manufacturing process diagram for explaining a fourth basic embodiment of a first crystalline film of the present invention and a producing method thereof.

BEST MODE FOR CARRYING OUT THE INVENTION

[Starting Film with Different Thickness]

Figure 1A:
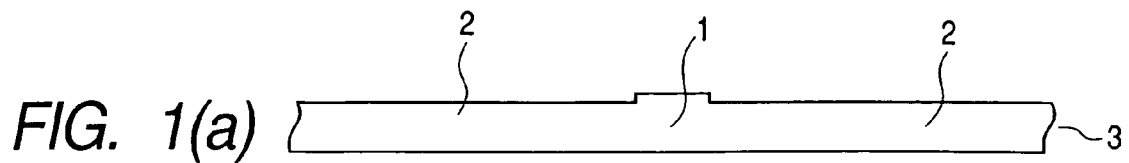
FIGS. 1(a), 1(b), 1(c), 1(d), 1(e), 1(f), 1(g), and 1(h) show a manufacturing process diagram for explaining a first basic embodiment of a first crystalline film of the present invention and a producing method thereof.

The first crystalline film of the present invention is prepared by melting and resolidifying a film formed by the aforementioned step (A), namely, a film in which a specific region and a region continuous to the periphery of the specific region and different in thickness from the specific region co-exist.

The most basic embodiment is shown in FIGS. 1(a) to 2(h), and developed forms are shown in FIGS. 3(a) to 6(h). In these illustrations, a film is schematically shown as a cross section in a direction perpendicular to the film surface or the interface with another adjacent layer positioned above or below the film. In the present invention, the film may be in contact with other layers provided above and below, but, in FIGS. 1(a) to 9, the film alone is illustrated and such other layers are omitted for the purpose of simplicity. In FIGS. 1(a) to 6(h), numerals 1 and 2 represent regions of mutually different thickness, and the region 1 has a thickness larger than that of the region 2. There are also shown a starting film 3, energy 4 provided for melting and resolidifying, a crystal grain or crystalline cluster 5, a crystal grain 6, an unresolidified region 7, a random group 8 of crystalline clusters, and a crystal grain boundary 9.

As verified in a report of Hatano et al. (Hatano, Moon, Lee, Suzuki and Grigoropoulos, J. Appl. Phys., 87, 36(2000)), when an energy for melting and resolidification is applied from the surface of the film, it is mostly absorbed in the vicinity of the film surface, and the film begins to melt from the vicinity of the surface and the melted layer expands toward the unmelted bottom portion of the film. When the film is sufficiently thin with respect to the given energy, the melted layer extends to the interface of the film and the substrate, and the entire film is completely melted. However, if the film is thick, the melted layer does not reach the interface between the film and the substrate even at its maximum melted state, and the film is cooled and resolidified in an incomplete melting state having an unmelted layer in the vicinity of the interface. In such a case, the unmelted layer remaining in the vicinity of the interface always contains crystal grains or crystalline clusters. This occurs with not only a starting film containing crystal grains or the crystalline clusters which remain unmelted, but also with a starting film being completely amorphous, because the unmelted layer deep in the film will crystallize in solid phase with the heat conducted from the melted layer.

Figure 1B:
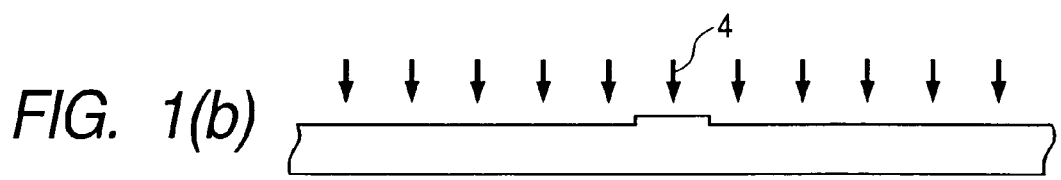
Figure 1C:
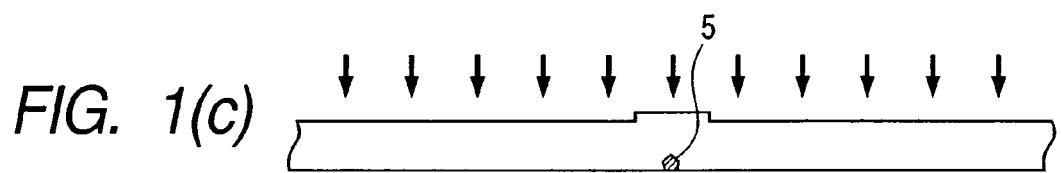
Figure 2A:
FIGS. 2(a), 2(b), 2(c), 2(d), 2(e), 2(f), 2(g) and 2(h) show a manufacturing process diagram for explaining a second basic embodiment of a first crystalline film of the present invention and a producing method thereof.
Figure 2B:
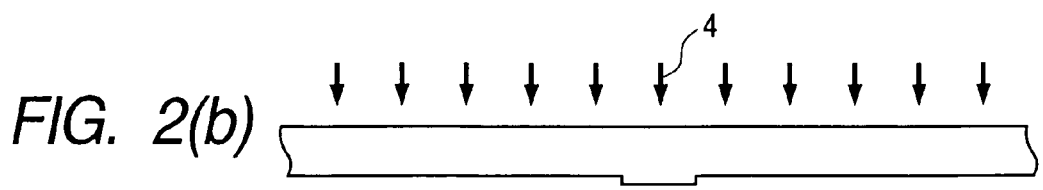
Figure 2C:
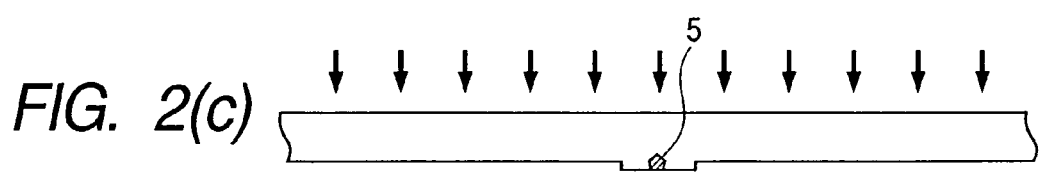

Consequently, as shown in FIGS. 1(a) and 2(a), when a starting film 3 having a thick region 1 and a thin region 2 in it in continuation and an energy 4 is provided for melting the starting film 3 from the free surface as shown in FIGS. 1(b) and 2(b), it is possible to attain such a condition that the region 2 is in a complete melting state while the region 1 is in an incomplete melting state containing unmelted portion in the vicinity of the interface of the film and the substrate. Thus, even in a maximum melt state shown in FIGS. 1(c) and 2(c), crystal grain(s) or crystalline cluster 5 are present in the vicinity of the interface between the region 1 and the substrate.

Figure 1D:
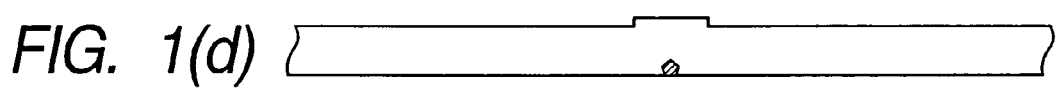
Figure 1E:
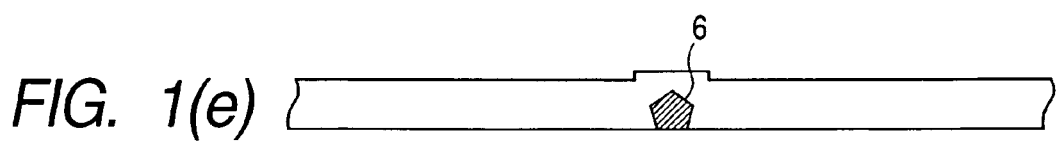
Figure 2D:
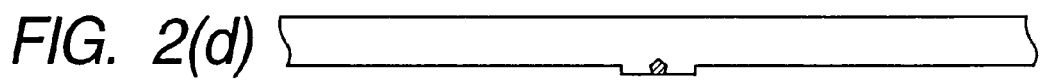
Figure 2E:
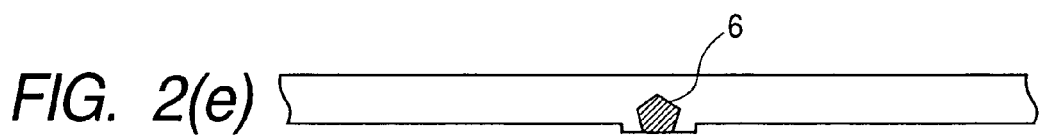

When the starting film 3 including the regions 1 and 2 differing in thickness is melted, application of the energy 4 is stopped [FIGS. 1(d) and 2(d)], and the film is cooled and resolidified. In this state, the complete melting region 2 maintains a melt state until supercooling proceeds to a certain degree. On the other hand, in the region 1, the crystal growth proceeds from the crystal grain or crystalline cluster 5 as seed crystal to solidify the surrounding molten film to become a crystal grain 6 [FIGS. 1(e) and 2(e)].

Figure 1F:
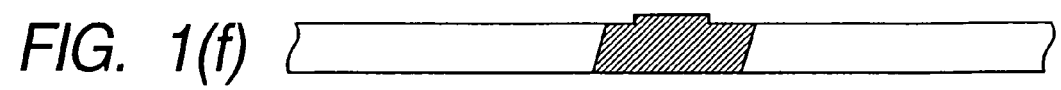
Figure 1G:
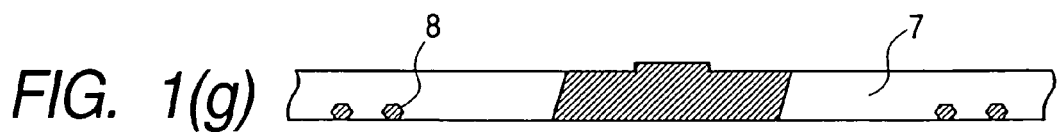
Figure 1H:
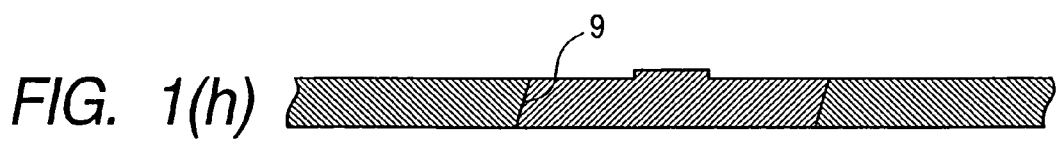
Figure 2F:
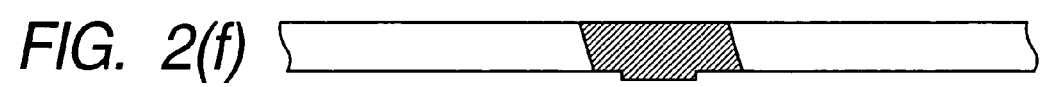
Figure 2G:
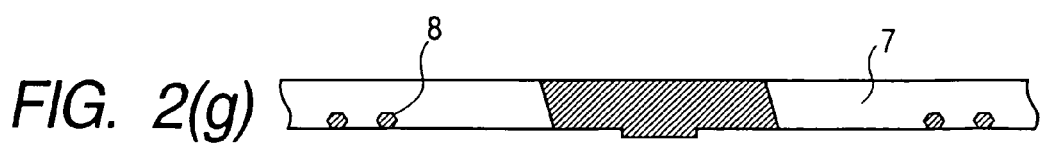
Figure 2H:
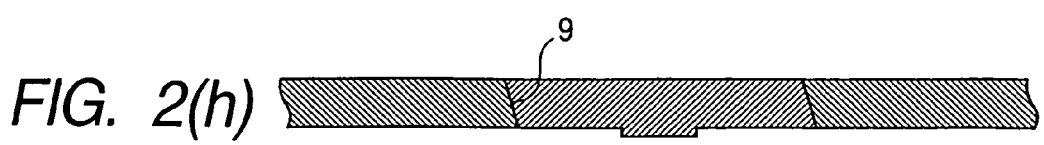
Figure 3A:
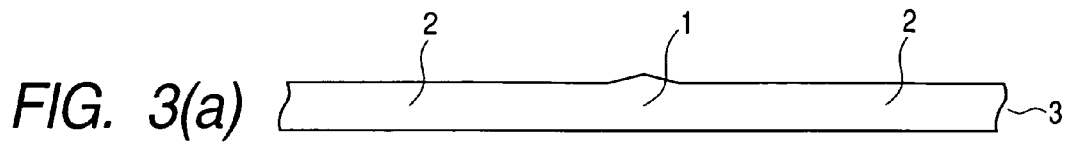
FIGS. 3(a), 3(b), 3(c), 3(d), 3(e), 3(f), 3(g) and 3(h) show a manufacturing process diagram for explaining a third basic embodiment of a first crystalline film of the present invention and a producing method thereof.
Figure 3B:
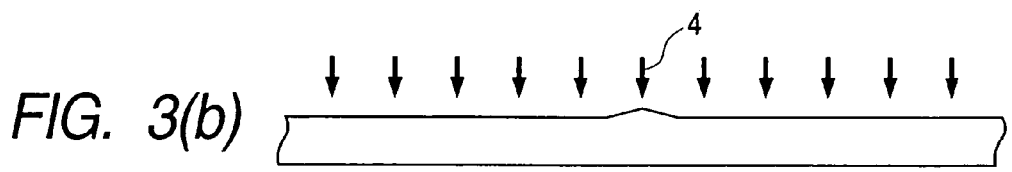
Figure 3C:
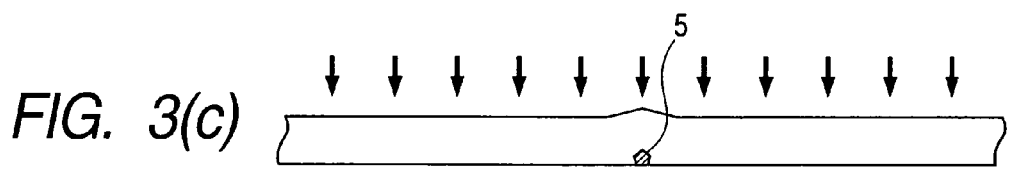
Figure 3D:
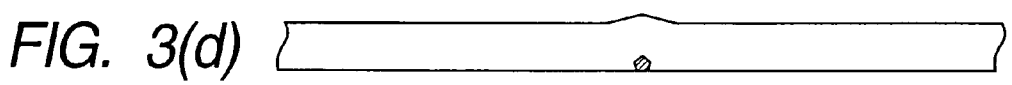
Figure 3E:
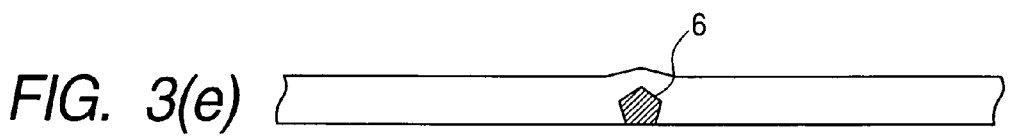
Figure 3F:
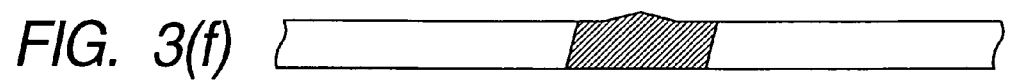
Figure 3G:
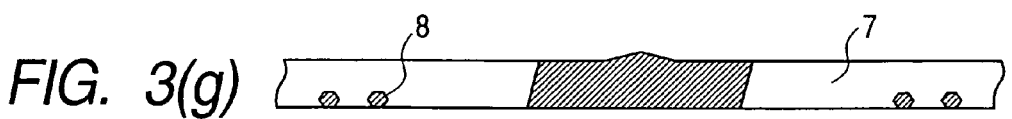
Figure 3H:
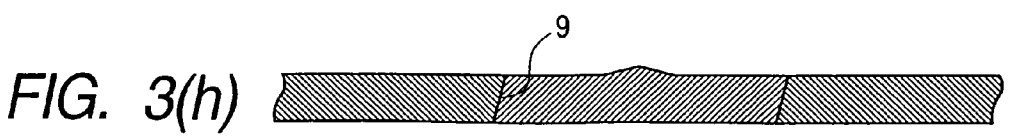
Figure 5A:
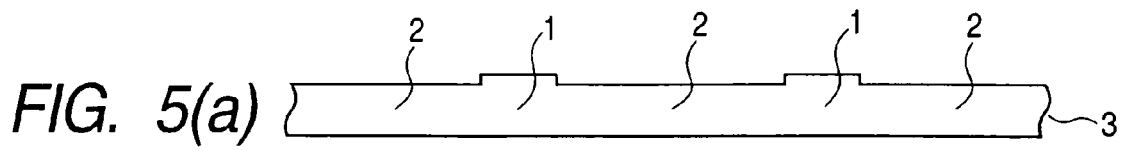
FIGS. 5(a), 5(b), 5(c), 5(d), 5(e), 5(f), 5(g) and 5(h) show a manufacturing process diagram for explaining another embodiment of a first crystalline film of the present invention and a producing method thereof.
Figure 5B:
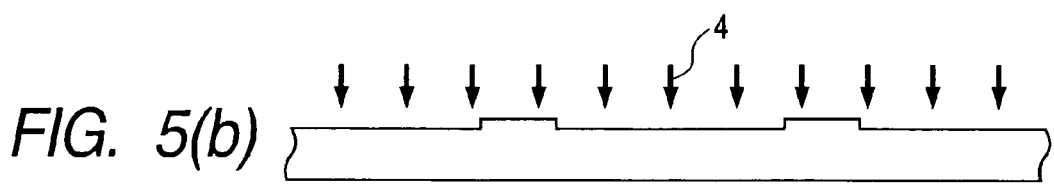
Figure 5C:
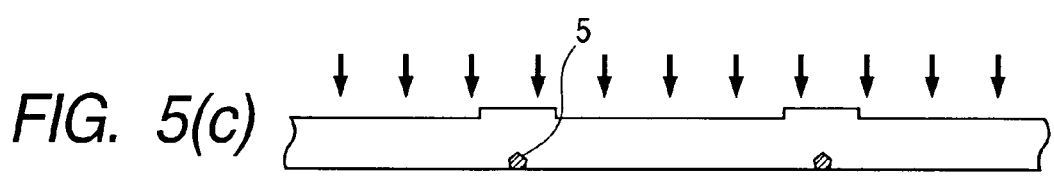
Figure 5D:
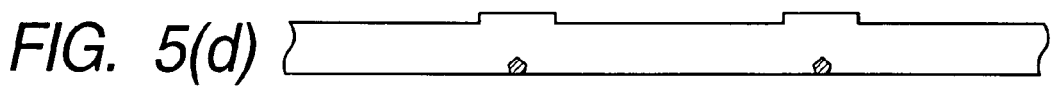
Figure 5E:
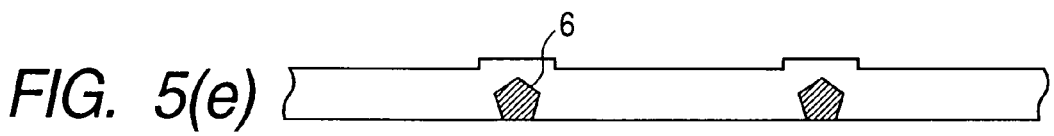
Figure 5F:
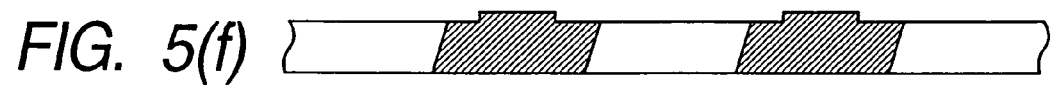
Figure 5G:
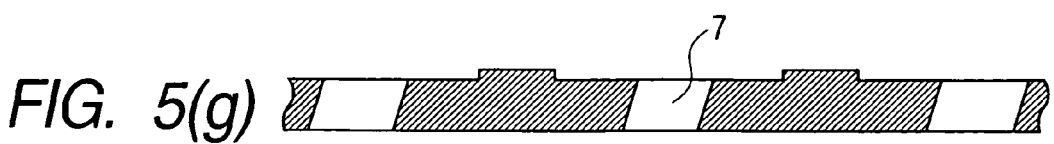
Figure 5H:
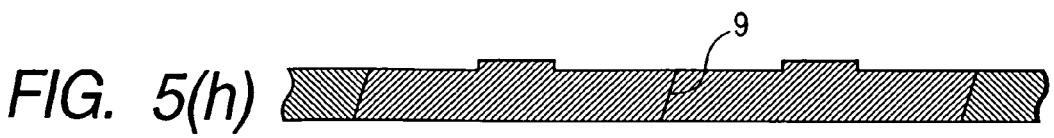
Figure 6A:
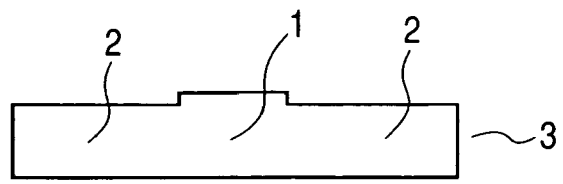
FIGS. 6(a), 6(b), 6(c), 6(d), 6(e), 6(f), 6(g) and 6(h) show a manufacturing process diagram for explaining another embodiment of a first crystalline film of the present invention and a producing method thereof.
Figure 6B:
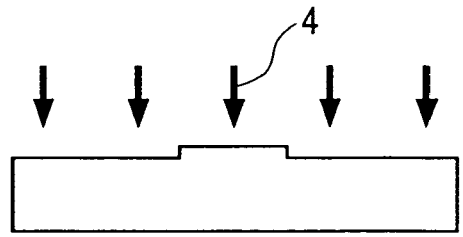
Figure 6C:
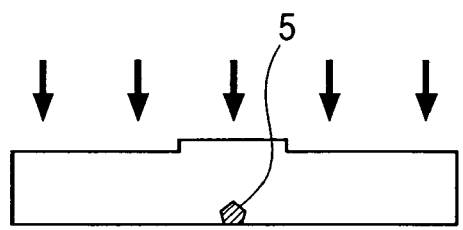
Figure 6D:
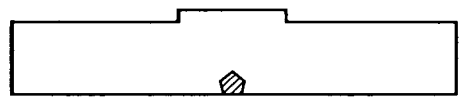
Figure 6E:
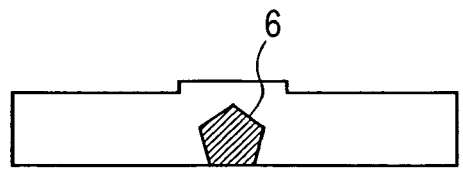
Figure 6F:
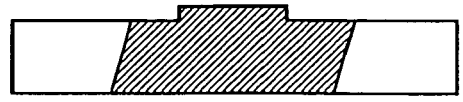
Figure 6G:
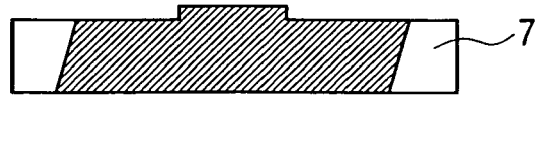
Figure 6H:
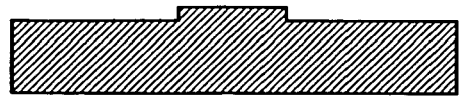

Thereafter, the crystal grain 6 continues to grow, exceeding the region 1 and solidifying the adjacent region 2 [FIGS. 1(f) and 2(f)]. However, the crystal grain 6 cannot grow infinitely. In an unsolidified region 7 not yet solidified by the growing crystal grain 6, explosive spontaneous nucleation of crystal grains or crystalline clusters 8 takes place in a random manner as supercooling proceeds [FIGS. 1(g) and 2(g)]. Growth of the crystal grain 6 from the region 2 is hindered by the crystal grains or crystalline clusters 8 of which position is not controlled, whereby a crystal grain boundary 9 is formed between them [FIGS. 1(h) and 2(h)]. As a result, according to the present embodiment, a crystalline film is formed by melting and resolidifying, in which the position of the crystal grain 6 is controlled to have the region 1 as a center.

In order to leave a single crystal grain 6 unmelted in the region 1 at the maximum melting state of the starting film 3 and to make such a crystal grain grow, it is necessary to appropriately control the size (hereinafter also called dimension) of the region 1 viewed from the surface of the film, or the area and film thickness, the condition of the starting film 3, and energy 4 to be provided for melting. The condition of the starting film 3 means, in case the film is including crystal grains or crystalline clusters, size and density distribution of the crystal grains or crystalline clusters, a parameter determining solid-phase crystallizing rate, and, in case the film is completely amorphous, it means a parameter determining frequency of solid-phase nucleation and solid-phase crystallizing rate. These parameters should have such a value that a single crystal grain 6 remains unmelted in the region 1 at the maximum molten state in combination with the dimension of the region 1 or the area and thickness thereof, and with the energy 4. Also the energy 4 should be enough for completely melting the region 2, but should not exceed the minimum energy required for completely melting the region 1.

In the present invention, instead of forming a fine hole of a high aspect ratio as in the prior technology, a region slightly thicker than the periphery is provided in the starting film 3 as shown in FIG. 1(a). Such a specific region 1 is not distributed randomly in the starting film 3, but is provided at specific predetermined positions, with a predetermined projected dimension or area and with a predetermined interval.

In the present invention, the unmelted crystal grain does not grow over a long distance vertically by the growth is limited to the lateral growth in the plane of the film, not as in the prior art. In other words, in the present invention, a single crystal grain or crystalline cluster is left unmelted at the maximum molten state and a crystal grain grows therefrom, and the selection of a single crystal grain is not executed by a vertical crystal growth in a fine hole as in the prior technology. Therefore, a fine hole of a high aspect ratio is not required.

A larger thickness in the specific region 1 is necessary for defining the position of the crystal grain or the crystalline cluster remaining unmelted, but is not particularly required in the subsequent resolidification step. Rather, the discontinuity or unevenness in growth resulting from the uneven film thickness is not preferable. As will be explained later, in the present invention, the aspect ratio is set small within a certain range so as to approximate to the uniform and continuous crystal growing conditions as in the absence of a film thickness difference as close as possible.

Also as shown in FIGS. 1(d) to 1(h), in the resolidification process after melting, the crystal grain grows three-dimensionally, i.e., in the vertical direction (direction of thickness) and in the lateral direction (planar direction of film), in the very early stage, but grows only two-dimensionally (in the lateral direction) after the vertical growth reaches the film surface. As it is preferable to terminate the vertical growth early and to allow the crystal grain only the two-dimensional growth in the lateral direction in order to obtain uniform crystal grains, shorter time from the start of crystal growth to the arrival of the growth front to the film surface is preferable, in addition to the uniformity of the film thickness mentioned above.

In the present invention, the ratio of the dimension of the specific region to the difference of the film thickness between the specific region and the periphery region (film thickness difference) is set larger than the ratio of the crystal growth velocity in the planar direction to that in the film thickness direction in the specific region when the single crystal grain or single crystalline cluster existing in the specific region grows in the resolidification stage. Thus, when a single crystal grain or crystalline cluster existing in the specific region grows in the resolidification stage, the growth front in the thickness direction moves a distance corresponding to the thickness difference in the specific region at latest before the growth front in the planar direction reaches the periphery of the specific region. Thereafter, growth in the thickness direction is considered to proceed from the growth front as a growing nucleus, in the same or similar conditions as in the periphery region of the same thickness. In this manner, unevenness in the growth resulting from the film thickness can be suppressed. Also duration of the two-dimensional growth in the lateral direction becomes longer, to obtain uniform crystal grains.

Preferably, the ratio of the dimension of the specific region to the film thickness of the specific region is set larger than the ratio of the growth velocity in the planar direction to the growth velocity in the film thickness direction in the specific region when the single crystal grain or the single crystalline cluster existing in the specific region grows in the resolidification stage. Thus, when the single crystal grain or the single crystalline cluster existing in the specific region grows in the resolidification stage, the growth front in the film thickness direction reaches the film surface at latest before the growth front in the planar direction reaches the periphery of the specific region. In this manner, duration of the two-dimensional growth in the lateral direction becomes longer than that under the above-mentioned condition, thereby more uniform crystal grains can be obtained.

On the other hand, in case the aspect ratio of the specific region is made higher in excess of the aforementioned condition, the growth in the planar direction proceeds and reaches the boundary between the specific region and the peripheral region thereof before the growth front of the crystal grain in the film thickness direction reaches the film surface of the specific region, whereby the duration of the two-dimensional growth becomes short and the uniformity of the crystal grains is deteriorated.

In the present invention, the film is melted to reach near complete melting state in the specific region 1, differing from the prior art where the film is completely melted in the hole. Also in the present invention, the film is melted not to leave plural crystal grains at the bottom of the hole as in the prior art but to leave a single crystal grain in the region 1 assuming a near complete melting state. Therefore the present invention does not require the "grain filtering" process as in the prior technology. Also a single crystal grain can securely grow in a small region.

In the following, variations of the present invention will be explained.

FIGS. 1(a) to 2(h) illustrate embodiments where the film thickness changes discontinuously between the regions 1 and 2 and the film thickness is uniform in the region 1, but the present invention is not limited thereto. More specifically, as shown in FIGS. 3(a) to 4(h), the film thickness may be continuous at the boundary of both regions and may change continuously within the region 1.

Also FIGS. 1(a) to 4(h) show embodiments in which the region 1, defining the position for forming the crystal grain 6, is a single domain surrounded by the region 2. In the present invention, such embodiments are not restrictive, and the region 1 may be provided as plural units in a discontinuous and discrete manner.

FIGS. 5(a) to 5(h) show an embodiment in which the region 1 in FIGS. 1(a) to 1(h) is provided in plural units with a constant interval. In such a case, when the distance between the adjacent regions 1 is sufficiently small [FIG. 5(a)], growth fronts of the crystal grains 6 growing from these regions may collide thereby forming a crystal grain boundary 9 before explosive and spontaneous nucleation of the crystal grains or the crystalline clusters occurs without position control in the unsolidified region 7 between these regions in random manner, thereby covering the entire film with position-controlled crystal grains 6 of the substantially same size [FIG. 5(h)].

FIGS. 5(a) to 5(h) show a case where the region 1 corresponding to FIGS. 1(a) to 1(h) is provided in plural units, but similar steps can be employed when a type of region 1 as shown in FIGS. 2(a) to 4(h) is employed.

FIGS. 1(a) to 5(h) show embodiments in which the starting film 3 expands in the planar direction much larger than, at least, the region 1, the crystal grain 6 or the interval of plural regions 1. On the other hand, their size can be in comparable magnitudes. For example as shown in FIGS. 6(a) to 6(h), when the size of the starting film 3 in the planar direction is small [FIG. 6(a)], it is possible that the growth of the crystal grain 6 reaches the entire region of the starting film 3 before explosive and spontaneous nucleation of the crystal grains or the crystalline clusters occurs without position control in the unsolidified region 7 between these regions in a random manner, to obtain a resolidified film constituted solely of the crystal grain 6 [FIG. 6(h)]. The melting and resolidification shown in FIGS. 6(a) to 6(h) show a case of employing the region 1 in FIGS. 1(a) to 1(h), but are applicable also to cases of employing the region 1 as shown in FIGS. 2(a) to 4(h). Also the starting film 3 shown in FIGS. 6(a) to 6(h) may be provided in plural units in discrete manner on or in a substrate omitted in these drawings.

FIGS. 1(a) to 6(h) illustrate embodiments in which the regions 1, 2 of two types of mutually different film thicknesses co-exist in the starting film 3, but the regions of different thicknesses may be present in three or more types. Also the regions 1 of the types of FIGS. 1(a) to 4(h) may be present at the same time.

Next, FIGS. 7 to 10 show examples of the element of the present invention utilizing the crystalline film prepared by the above-described melting and resolidifying process where the film has the region 1 in a form shown in FIGS. 2(a) to 2(h). In FIGS. 7 to 10, as in FIGS. 1(a) to 6(h), the film is illustrated by a partial cross section in a direction perpendicular to the surface or interface thereof. In FIGS. 7 to 10, the crystal grains or crystalline clusters 8 generated by the random spontaneous nucleation as shown in FIGS. 1(a) to 4(h) are omitted, and the position-controlled crystal grain 6 alone is illustrated. Also a substrate 100 supporting the film is illustrated whenever necessary.

In the crystalline film of the present invention, the position of the crystal grain 6 is determined by the position of the region 1, and the size thereof is also known. Therefore, in forming an element utilizing the crystal grain 6 as an active area, it is easily possible to correlate the active area of the element utilizing the crystal grain 6 with the position thereof. For example, it is possible to limit an active area 10 of an element to the interior of the crystal grain 6. In such a case, since the active area 10 of the element does not contain a crystal grain boundary, it is possible to improve the element properties and to suppress fluctuation between plural elements.

Figure 8:
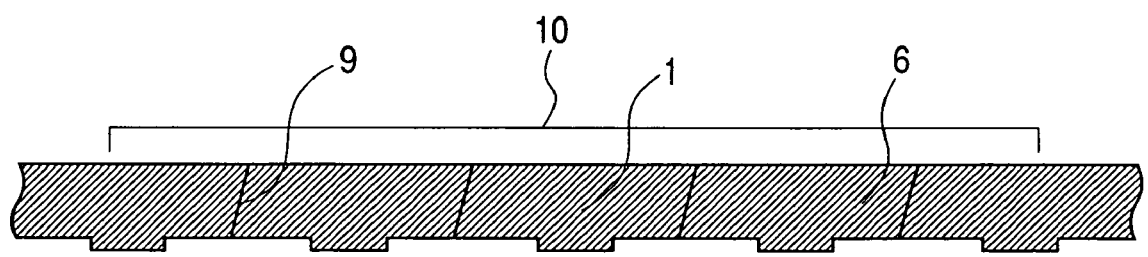
FIG. 8 is a diagram explaining a first basic embodiment of an element of the present invention.

Also in a crystalline film obtained by the process of providing plural regions 1 as shown in FIGS. 5(a) to 5(h), it is possible to form an active area 10 of an element in a region including crystal grains 6 of a desired number as shown in FIG. 8. Also in such a case, since the position of the regions 1 is known, it is possible to control the number of the crystal grain 6 contained in the active area 10 of the element, or the density of the crystal grain boundary 9. It is therefore possible to suppress fluctuation between plural elements.

Figure 7:
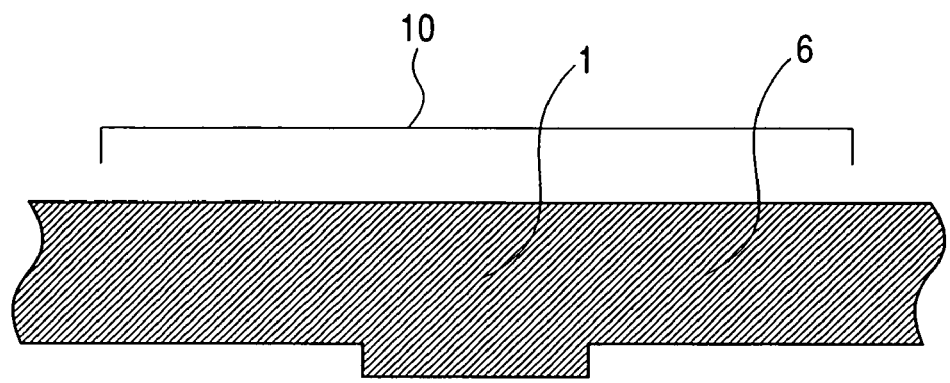
FIG. 7 is a diagram for explaining a first basic embodiment of an element of the present invention.

The active area of the element shown in FIGS. 7 and 8 is formed by providing appropriate input/output terminals to the crystal grain 6. According to the type of the element, the input/output terminals may be provided in any position such as the upper face, the lower face or an edge face of the film constituting the crystal grain 6. Also depending on the type of a signal inputted into or outputted from the active area of the element, the input/output terminal may be in contact with the crystal grain or separated therefrom.

Figure 9:
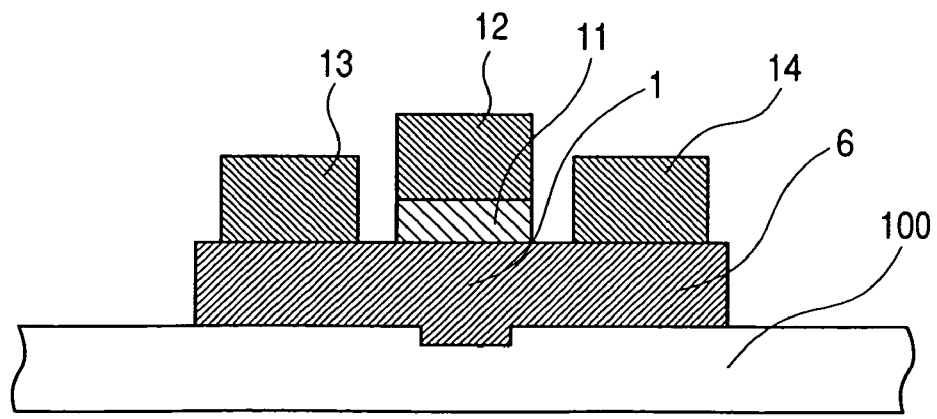
FIG. 9 is a diagram explaining another embodiment of an element of the present invention.
Figure 10:
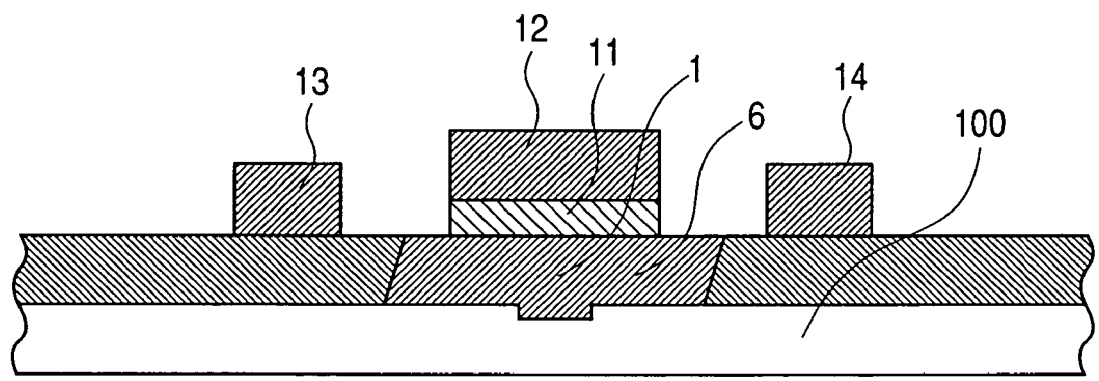
FIG. 10 is a diagram explaining another embodiment of an element of the present invention.

As a typical example of an element of the present invention, FIGS. 9 and 10 show an example where a MOS thin film transistor (TFT) is formed in a crystalline film composed of a semiconductive material. There are shown a gate insulation film 11, a gate electrode 12, a source electrode 13, a drain electrode 14, and a substrate 100.

Figure 12:
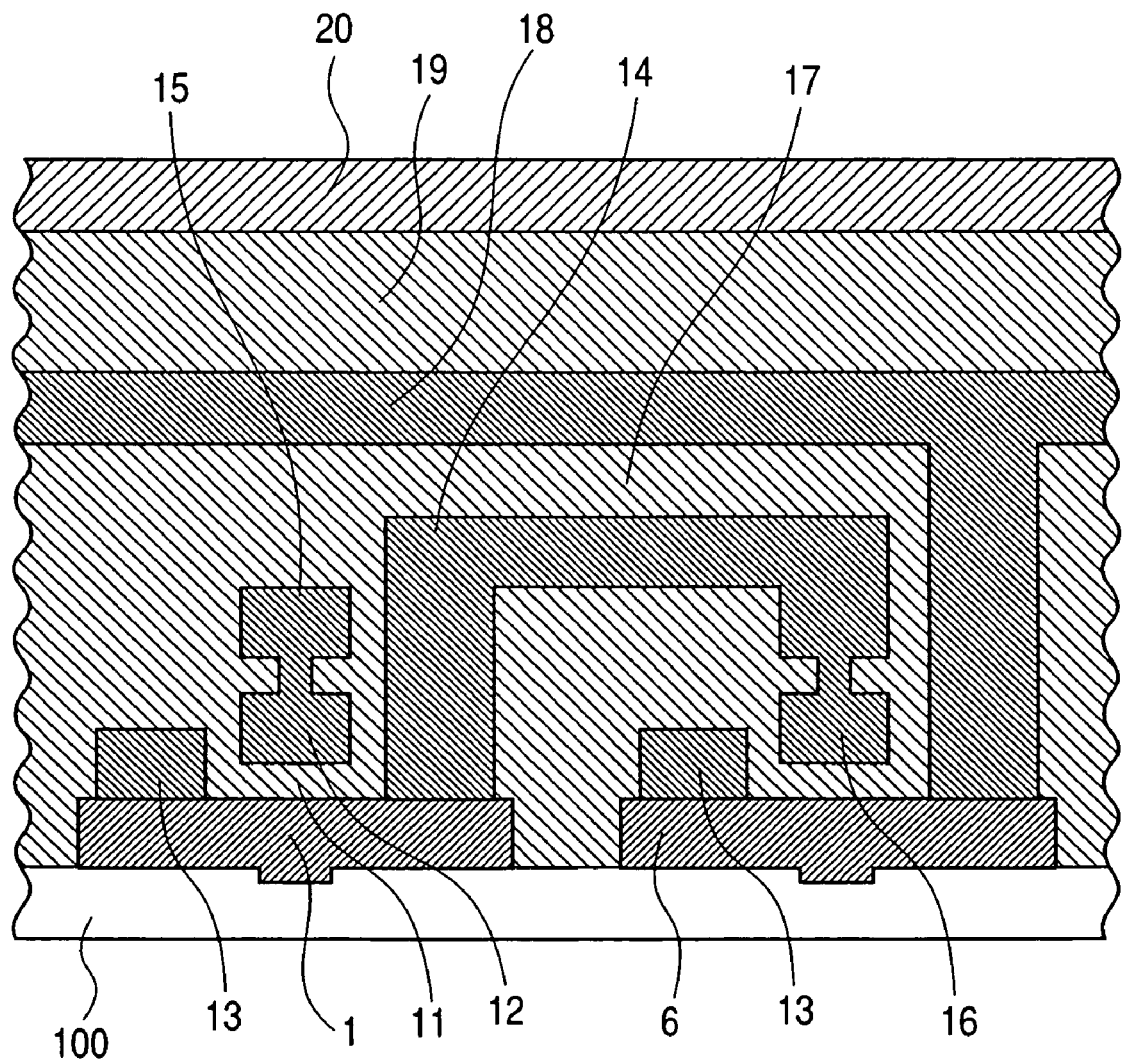
FIG. 12 is a diagram explaining an embodiment of an apparatus of the present invention.

An element shown in FIG. 9 is a MOS TFT employing a single crystal grain 6 provided in an isolated manner on the substrate 100 by the process shown in FIGS. 6(a) to 6(h). On the surface of the crystal grain 6, there are provided a gate electrode 12 across a gate insulation film 11, a source electrode 13 and a drain electrode 14, and a channel area, a source area and a drain area are formed by conductivity control in the regions of the crystal grain 6 under the respective electrodes. In the present element, a high performance can be expected because the entire element is formed inside a single crystal grain 6 and includes no crystal grain boundary. Also when plural elements shown in FIG. 12 are provided on the same substrate 100, it is possible to reduce performance fluctuation between such plural elements. Alternatively, it is also possible, as shown in FIG. 10, to form a gate area only in the single crystal grain 6 grown around the region 1 of a crystalline film provided on a substrate 100 by the process shown in FIGS. 1(a) to 4(h), and to form a source area or a drain area in a region containing the crystal grains or crystalline clusters 8 grown adjacent to the crystal grain 6 and not controlled in position. In such a MOS TFT, since the device characteristics are principally governed by a charge transfer in a channel region constituting an active area, the element shown in FIG. 10 can achieve high performance and reduced fluctuation between plural elements, as in the element shown in FIG. 9.

FIGS. 9 and 10 show a case where the active area of the element does not include any crystal grain boundary, but, in the crystalline film having the position-controlled crystal-grain boundary 9 by the process as shown in FIGS. 5(a) to 5(h), it is also possible to include the crystal grain boundary 9 in the active area of the element as shown in FIG. 8. In such a case, the device characteristics are inferior in absolute value to those in the element not including the crystal grain boundary, but the fluctuation among plural elements can be suppressed because the density of the crystal grain boundary contained in the active area can be controlled.

Figure 11:
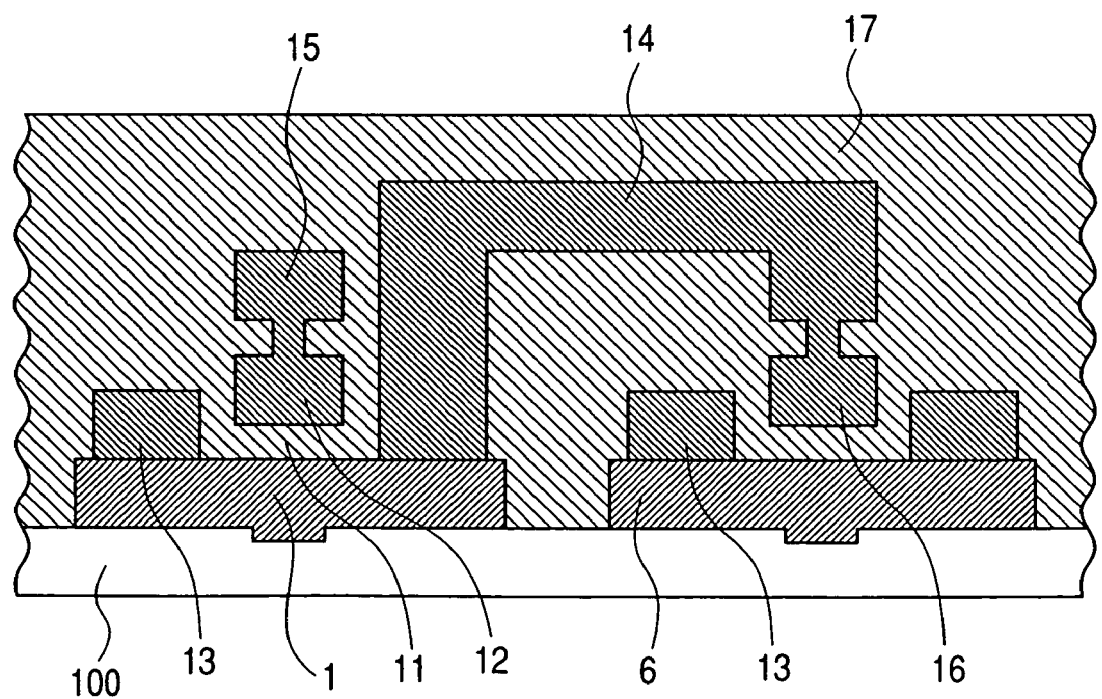
FIG. 11 is a diagram explaining an embodiment of a circuit of the present invention.

FIG. 11 shows an example of a circuit of the present invention, constituted utilizing an element of the present invention as explained above. In FIG. 11, there are shown a gate wiring electrode 15 of a first TFT, a gate electrode 16 of a second TFT, and an insulation layer 17. The present circuit includes, as a part thereof, two MOS TFTs on the same substrate 100, constituted of a single crystal grain 6 grown from a region 1, as shown in FIG. 9. A drain electrode 14 of the first TFT controlled by a gate electrode 12 is connected through a wiring to a gate electrode 16 of the second TFT, and such electrodes and wirings are mutually insulated by an insulation layer 17. More specifically, the second TFT controlled by the gate electrode 16 is controlled by a drain voltage of the first TFT. In such a circuit, it is important that the device characteristics of the first and second TFTs are strictly controlled, and the present circuit composed of elements not containing the crystal grain boundary in the active areas can meet such a condition.

Finally, FIG. 12 shows a part of an image display apparatus, as an example of an apparatus of the present invention, including the aforementioned circuit of the present invention, wherein shown are an electrode 18, a light emitting layer or a layer with variable optical transmittance 19, and an upper electrode 20. This apparatus includes, as a part thereof, two connected TFTs as shown in FIG. 11. A drain electrode of a second TFT is connected to an electrode 18 of the device. On the electrode 18, there is provided a light emitting layer or a layer with variable optical transmittance 19, and an electrode 20 is provided further thereon. Thus, an applied voltage or an injected current to the light emitting layer or the layer with variable optical transmittance by the electrode 18 and the upper electrode 20 is determined by a drain voltage or current of the second TFT, controlled by a drain voltage of the first TFT. The light emission intensity of the light emitting layer or the optical transmittance of the layer with variable optical transmittance is controlled by a voltage applied or a current injected thereto. The image display apparatus of the present embodiment utilizes such an element configuration as a display unit of a pixel, and is constituted by arranging such a pixel in plural units and in a lattice arrangement. In order to obtain a uniform light intensity and a uniform response time as an image display apparatus, it is important to suppress the fluctuation in characteristics among the pixels, and the present apparatus utilizing a circuit formed by elements not including the crystal grain boundary in the active area can meet such a requirement.

As explained in detail above, the present invention has achieved easy spatial positional control of a crystal grain in a crystalline film formed by melting and resolidification, by providing regions of which thickness is mutually different in continuation in the starting film.

[Irradiation with Electromagnetic Wave or with Particles Having a Mass]

The second crystalline film of the present invention and a producing method thereof are characterized in that a film to be subjected to melting and resolidifying is formed by the aforementioned step (B), namely a specific region and a peripheral region thereof in a starting film is irradiated by an electromagnetic wave or particles having a mass with different irradiation conditions.

Prior to the present invention, the inventors found that irradiation by electromagnetic wave or particles having a mass influences melting and resolidification of a film. Such a phenomenon will be briefly explained to assist understanding of the present invention and the history leading thereto.

In the melting and resolidification of a film, phase structure of the film at a maximum melt state will vary according to the energy provided for melting, leading to a change in the polycrystalline grain structure after solidification. In case the provided energy is sufficiently large, the entire film is melted at the maximum melt state (complete melting), and, when the molten film is supercooled to a certain degree, a rapid nucleation takes place in the molten phase to form a polycrystalline structure constituted of fine crystal grains. In case of complete melting, the average crystal grain size is principally determined by a free energy barrier W* to crystal nucleation. On the other hand, in case the provided energy is small, the film at the maximum melt state still contains crystal grains (remaining crystal grains) at a high concentration in the molten matrix (incomplete melting), and, during the following cooling of the film, crystallization proceeds from such crystal grains as seed crystals. As a result, there is also formed a polycrystalline structure constituted of fine crystal grains. Therefore, as energy is applied beyond the incomplete melting condition, the concentration of the remaining crystal grains decreases until the maximum melting state and the average polycrystalline grain size after solidification will increase, but beyond a certain critical energy Ec, complete melting occurs and the average grain size after solidification will decrease again. In other words, the maximum temperature the film will reach when Ec is applied is a macroscope melting point of the film. Immediately before Ec (near complete melting), the concentration of the remaining crystal grains becomes extremely low, and most portion of the film solidifies with nucleation from a molten phase as in the complete melting state, but such remaining crystal grains grow laterally rapidly (super lateral growth: SLG) before such nucleation occurs, leading to a granular structure in which SLG crystal grains are randomly scattered in a fine polycrystalline region. In incomplete melting and near complete melting, the concentration of the remaining crystal grains in the film strongly depends on the solid-phase crystallization process until the film reaches the maximum melt state. In case the starting film contains crystal grains or crystalline clusters and the solid-phase crystallization process is governed by the solid-phase growth of such crystal grains or crystalline clusters, the concentration of the remaining crystal grains is controlled by the initial concentration of the crystal grains or crystalline clusters contained in the starting film. In case the starting film is mostly amorphous and the solid-phase crystallization process is governed by the solid-phase nucleation from the amorphous phase, the concentration of the remaining crystal grains is determined by the height of the free energy barrier W* to the solid-phase nucleation.

The present inventors have found a phenomenon that the aforementioned critical energy Ec will change when the film is irradiated with electromagnetic wave or particles having a mass, prior to the melting and resolidification process. For example, when a silicon film was irradiated with infrared light, Ec decreased according to the intensity or the irradiation period of the infrared light. Also when a silicon film was irradiated with ionized silicon atoms, Ec decreased according to the acceleration energy or the irradiation amount of the ionized silicon atoms.

In other systems, Ec may increase with irradiation with electromagnetic wave or with particles having a mass.

The inventors also found that such a phenomenon was caused by various mechanisms according to the subject systems.

The present invention utilizes the aforementioned phenomenon. How the phenomenon is utilized will be explained in the following embodiments.

FIGS. 13(a) to 13(h) show a most basic embodiment of the crystalline film of the present invention and the producing method thereof, and FIGS. 14(a) to 14(h) show an extended form thereof. In these illustrations, a film is schematically represented by a cross section in a direction perpendicular to the surface of the film or an interface. In the present invention, the film may be in contact with other layers provided above or below, but, in FIGS. 13(a) to 14(h), the film alone is illustrated and such other layers are omitted. In FIGS. 13(a) to 14(h), there are shown a film 1 in a uniform state immediately after film formation, an irradiation 2 of an electromagnetic wave or particles having a mass under a first condition, an irradiation 3 of an electromagnetic wave or particles having a mass under a second condition, a small region 4 with a predetermined spatial position, a region 5 around the small region, an energy 6 for melting and resolidification, a crystal grain or a crystalline cluster 7, an unsolidified region 8, a crystal grain 9, a random crystalline cluster group 10, and a crystal grain boundary 11.

Figure 13A:
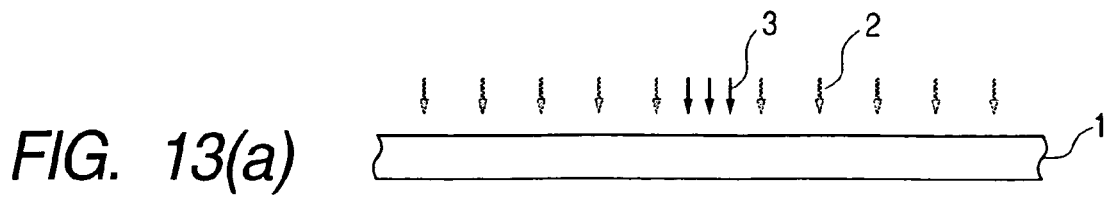
FIGS. 13(a), 13(b), 13(c), 13(d), 13(e), 13(f), 13(g) and 13(h) show a manufacturing process diagram for explaining a first basic embodiment of a second crystalline film of the present invention and a producing method thereof.
Figure 13B:
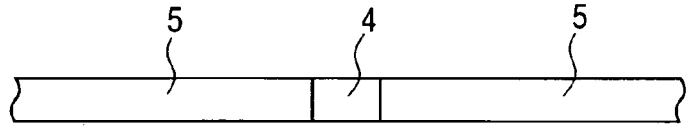

First, as shown in FIG. 13(a), a specific small region of the film 1 is irradiated locally with electromagnetic wave or particles having a mass under a first condition 2 while another region is irradiated with electromagnetic wave or mass particles under a second condition 3 to form a small region 4 and a peripheral region 5 thereof [FIG. 13(b)]. The irradiation 2 under the first condition and the irradiation 3 under the second condition may be executed simultaneously or in succession respectively in independent steps. In the latter case, the electromagnetic wave may be of different kinds, or the mass particles may be of different kinds. The irradiation with the electromagnetic wave or the mass particles of two kinds may be executed in any order. The irradiation 2 under the first condition and the irradiation 3 under the second condition need not be both executed locally, but it is sufficient that either one is executed locally.

The small region 4 and the peripheral region 5 can be irradiated with the electromagnetic wave or the mass particles in mutually different conditions for example by executing uniform irradiation under a first condition and then local irradiation under a second condition, or vice versa. Local irradiation can be achieved by a blanking of the scanning electromagnetic wave or mass particle beam, or by uniform irradiation utilizing a mask provided above the starting film 1.

Also irradiation density of the irradiation 2 under the first condition or that of the irradiation 3 under the second condition can be zero, that is, "no irradiation" for either one of the irradiations.

Figure 13C:
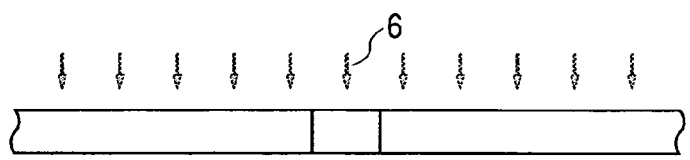
Figure 13D:
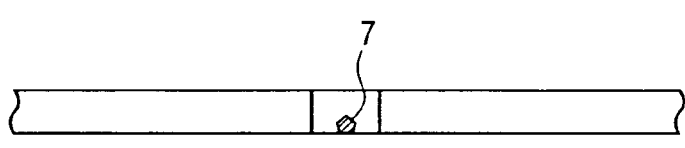

Then an energy 6 for melting and resolidification is applied to the film to melt the film [FIG. 13(c)]. In this operation, the peripheral region 5 is completely melted, while the small region 4 is in a near completely melted state. Ec is regulated within and outside the small region 4 to satisfy a relationship: critical energy Ec of peripheral region 5<energy 6≦critical energy Ec of small region 4, in the local irradiation 2 under the first condition and the irradiation 3 under the second condition. Thus, after the end of input of the energy 6 for melting and resolidification, a crystal grain or a crystalline cluster 7 exists in the small region 4 [FIG. 13(d)].

Figure 13E:
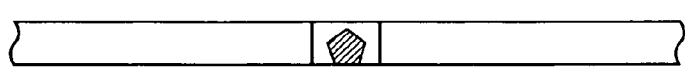
Figure 13F:
Figure 13G:
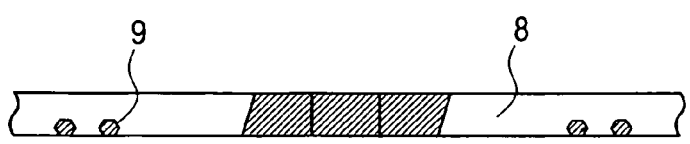
Figure 13H:
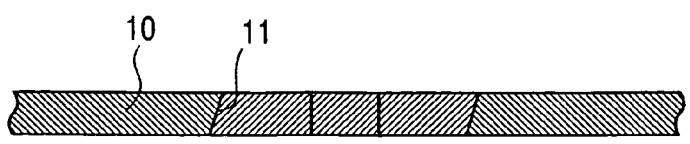
Figure 14A:
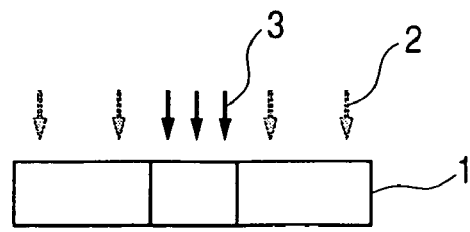
FIGS. 14(a), 14(b), 14(c), 14(d), 14(e), 14(f), 14(g) and 14(h) show a manufacturing process diagram for explaining a second basic embodiment of a second crystalline film of the present invention and a producing method thereof.
Figure 14B:
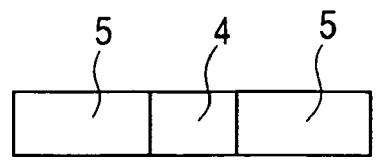
Figure 14C:
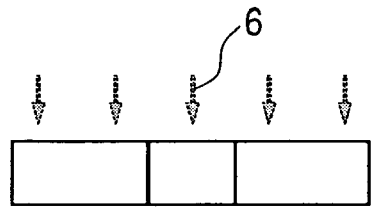
Figure 14D:
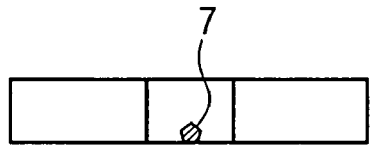
Figure 14E:
Figure 14F:
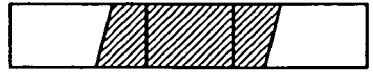
Figure 14G:
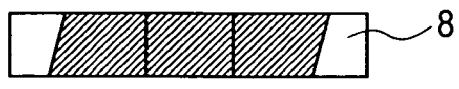
Figure 14H:
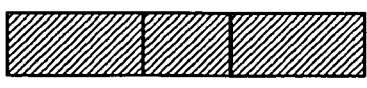

With the progress of cooling of the film thereafter, the crystal grain or the crystalline cluster 7 grows to form a crystal grain 7 [FIG. 13(e)]. The crystal grain 7 continues growth to reach the surface of the film, and further grows principally in the lateral direction exceeding the small region 4 and into the peripheral region 5 thereof [FIG. 13(f)]. Then, when the film is cooled and the supercooling degree increases in an unsolidified region 8 outside the small region, random crystal nuclei 9 are generated rapidly [FIG. 13(g)]. Then they collide with the crystal grain 7 to form a grain boundary 11 thereof. As a result, the present embodiment can form a crystalline film by melting and resolidification in which the position of the crystal grain 7 is defined around the specific region 4.

FIGS. 13(a) to 13(h) show an example of growing a single crystal grain 7 from a specific small region 4 for defining the position of the crystal grain 7, but it is also possible to grow two or more crystal grains 7 of a desired number in the small region 4.

Although FIGS. 13(a) to 13(h) show an embodiment in which the specific region 4 is a single domain surrounded by the peripheral region 5, in the present invention, such an embodiment is not restrictive and the specific region 4 may be provided in plural units in a uncontinuous and discrete manner. In such a case, when neighboring specific regions 4 are sufficiently separated, random crystalline clusters 10 are positioned between crystal grains 7 grown from or at respective specific regions 4. On the other hand, when the neighboring specific regions 4 are sufficiently close, the crystal grains 7 grown from or at respective specific regions 4 are in direct contact to form the crystal grain boundary 11 without the random crystalline clusters 10 therebetween. Also by periodically positioning the specific regions 4 with such a distance, it is possible to constitute the entire film with the position-controlled crystal grains 7.

Also FIGS. 13(a) to 13(h) show an example in which the specific region 4 and the peripheral region 5 are two-dimensionally provided in a planar direction of the film 1, but, in the present invention, a three-dimensional configuration including a direction of the thickness of the film 1 is also possible.

Also FIGS. 13(a) to 13(h) show an example in which a continuous range of the film 1 in the planar direction thereof is far larger than at least the small region 4, the crystal grain 7 or the interval of the plural small regions 4.

On the other hand, it is also possible to set the both in a comparable dimension. For example as shown in FIGS. 14(a) to 14(h), by forming a small region 4 surrounded by a peripheral region 5 in a film 1 of a size similar to that of the crystal grain 7 in FIGS. 13(a) to 13(h) [FIG. 14(b)], it is possible that the growth of the crystal grain 7 reaches the entire region of the film 1 before the crystal nuclei 9 are generated randomly and rapidly in the unsolidified region 8, to obtain a resolidified film constituted solely of the crystal grain 7 [FIG. 14(h)].

The film 1 shown in FIGS. 14(a) to 14(h) may be provided in plural units in a discrete manner on or in a substrate omitted in these drawings.

As explained above, according to the present invention, an easy spatial position control of the crystal grain in the crystalline film formed by melting and resolidification can be achieved by irradiating the specific region and the peripheral region thereof with electromagnetic wave or mass particles under mutually different conditions and then by carrying out melting and resolidification.

[Adjacent Interval and Supercooling Condition]

FIGS. 15(a) to 15(h) show a third crystalline film of the present invention and a producing method thereof. In these illustrations, a film is schematically represented by a cross section in a direction perpendicular to a surface of the film or an interface. In the present invention, the film may be in contact with other layers provided above and below, but, in the illustrations, the film alone is illustrated and such other layers are omitted.

Figure 15A:
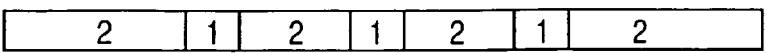
FIGS. 15(a), 15(b), 15(c), 15(d), 15(e), 15(f), 15(g) and 15(h) show a manufacturing process diagram for explaining a basic embodiment of a third crystalline film of the present invention and a producing method thereof.

FIG. 15(a) shows a film before melting and resolidification, namely a starting film.

Figure 15B:
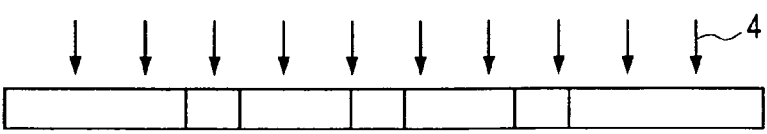

FIG. 15(b) shows an energy charging to the starting film.

Figure 15C:
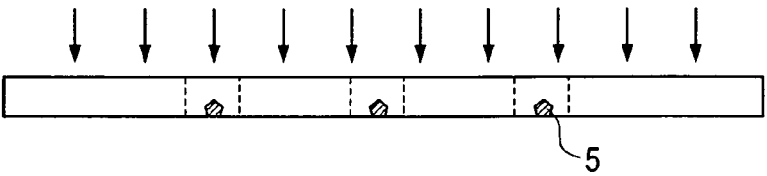

FIG. 15(c) shows the film immediately before the end of energy charging.

Figure 15D:
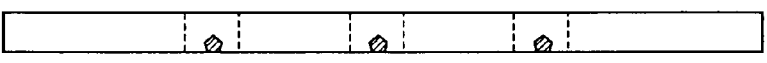

FIG. 15(d) shows the film immediately after the end of energy charging.

Figure 15E:
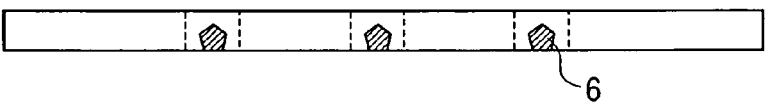

FIG. 15(e) shows the film in an initial stage of a resolidification.

Figure 15F:
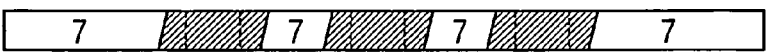

FIG. 15(f) shows the film while the resolidification is in progress.

Figure 15G:
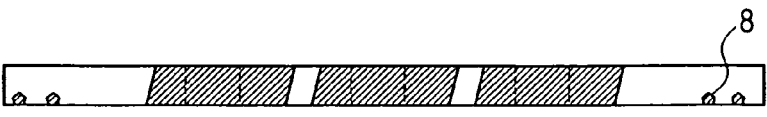

FIG. 15(g) shows the film in a final stage of the resolidification.

Figure 15H:

FIG. 15(h) shows the film after the end of the resolidification.

In FIGS. 15(a) to 15(h), there are shown a specific small region 1 having a state different from a peripheral region thereof, a peripheral region 2, a film 3 before melting and resolidification, namely a starting film, in which the small region 1 and the peripheral region 2 are provided in advance, an energy 4 charged for melting and resolidification, a crystalline cluster 5, a crystal grain 6, an unsolidified region 7, random crystalline clusters 8, and a crystal grain boundary 9.

As shown in FIG. 15(a), in the starting film 3, the small region 1 is provided in a predetermined specific position, and the peripheral region 2 exists therearound in continuation. An energy 4 for melting the starting film 3 is provided as shown in FIG. 15(b).

The specific small region 1 and the peripheral region 2 have different film states as explained in the following.

The specific region 1 and the peripheral region 2 in the starting film are different in a size distribution of the concentration of the crystal grains or the crystalline clusters existing in an unmelted state in the melting and resolidification. Otherwise, they are different in a melting point of a bulk portion of the crystal grain or the crystalline cluster, of a surface thereof, of a grain boundary between adjacent crystal grains or crystalline clusters or of the amorphous region thereof. Otherwise, they can be regions different in a size distribution of the concentration of the crystal grains or the crystalline clusters contained in an amorphous matrix, regions different in a size distribution of the concentration of crystal grains constituting a polycrystalline film, a polycrystalline region and an amorphous region, regions different in a height of nucleation free energy barrier in solidification from a molten phase, or regions different in a height of nucleation free energy barrier in solid-phase crystallization of an amorphous starting film before the melting. The above-mentioned regions different in the height of nucleation free energy barrier can be prepared by forming regions different in element composition, impurity content, substances absorbed to the surface or in an interfacial state with a substrate in contact with the film.

As the starting film provided with such a specific region, there can also be employed a film subjected to the aforementioned step (A) or (B).

The "size distribution of concentration of crystal grains or crystalline clusters" is a physical amount defined by a number of crystal grains or crystalline clusters per unit volume as a function f(g) of a size g. Therefore, in a comparison of two "size distributions of concentration of crystal grains or crystalline clusters", they are different "size distributions of concentration of crystal grains or crystalline clusters" unless f(g) is equal with all g values in the entire size space (g>0). Stated differently, two regions in the film have the same "size distribution of concentration of crystal grains or crystalline clusters" only when with the crystal grains or the crystalline clusters contained per unit volume, the particle sizes thereof and the absolute numbers of the crystal grains or the crystalline clusters at each size mutually coincide.

By forming the regions 1 and 2 in the starting film as contiguous regions having any of such different states, it becomes possible to control the position of the crystal grain in the crystalline film after the melting and resolidification.

Specifically, from a final stage of the melting step of the film [FIG. 15(c)] to a state after the end of charging of the energy 4 [FIG. 15(d)], one or more crystal grains or crystalline clusters 5 of a predetermined number exist in the specific region 1, while, in the peripheral region 2, crystal grain or crystalline cluster exists at a concentration sufficiently lower than the concentration of the crystal grain or the crystalline cluster in the specific region 1 or does not exist at all resulting in complete melting of the peripheral region 2.

Otherwise, in a final stage of the melting step of the film, the specific region 1 and the peripheral region 2 both melt completely, but the specific region 1 has a nucleation free energy barrier W* lower than that of the peripheral region 2 in the solidification step after the end of charging of the energy 4, whereby nucleation of a crystal grain or crystalline cluster 5 occurs preferentially in the specific region 1 while supercooling degree of the molten film is still small.

By melting and resolidifying the starting film 3 including the specific small region 1 and the peripheral region 2 with such mutually different states, crystal growth proceeds from the crystal grain or crystalline cluster 5 as a seed crystal, thus solidifying the surrounding film in a molten phase to form a crystal grain 6 [FIG. 15(e)]. Thereafter, the crystal grain 6 continues to grow, exceeding the specific region 1 and solidifying the contiguous peripheral region 2 [FIG. 15(f)].

However, the crystal grain 6 cannot grow infinitely. In an unsolidified region 7 which is not solidified by the growth of the crystal grain 6, explosive spontaneous nucleation of crystal grains or crystalline clusters 8 takes place in a random manner with an increase in the supercooling [FIG. 15(g)]. The growth of the crystal grain 6 growing from the specific region 1 is hindered by the crystal grains or crystalline clusters 8 which are not position controlled, whereby a crystal grain boundary 9 is formed between the two [FIG. 15(h)]. As a result, there can be formed a crystalline film by melting and resolidification, in which the position of the crystal grain 6 is controlled around the specific region 1.

At the growth of the crystal grain 6, a latent heat (heat of solidification) is released at the growth front. FIGS. 16(e) to 16(h) schematically show temperature distributions in the film in the steps of FIGS. 15(e) to 15(h). FIGS. 16(e) to 16(h) indicate temperature distributions respectively at growth stages in FIGS. 15(e) to 15(h). In stages of energy charging to the film in FIGS. 15(a) to 15(b), the temperature is uniform over the entire film.

Figure 16E:
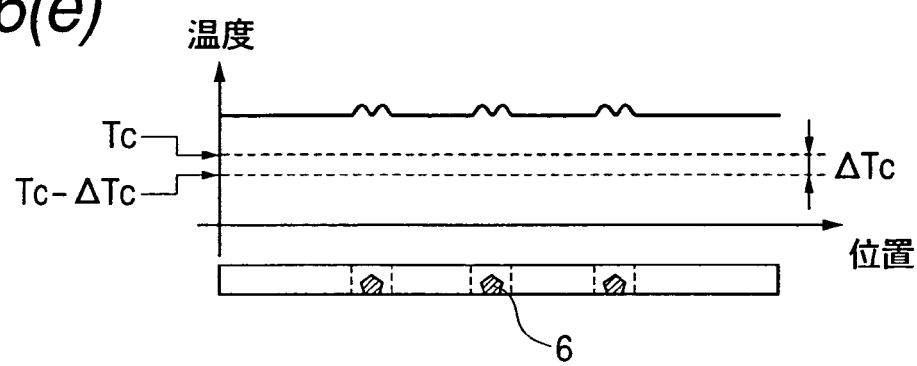
FIGS. 16(e), 16(f), 16(g), 16(h) show a diagram showing temperature distributions in a film corresponding to the steps of FIGS. 15(e), 15(f), 15(g), and 15(h). Temperature distributions corresponding to steps of FIGS. 15(a), 15(b), 15(c), and 15(d) are omitted.

From immediately after the end of energy charging shown in FIG. 15(d), the film is cooled by heat dissipation to adjacent upper and lower layers (not shown), and the temperature starts to lower. The region 2 remains in a molten phase in a supercooled state because of absence of a solidifying nucleus when the temperature becomes lower than a bulk solidifying point Tc, while, in the specific region 1, the crystal grain or crystalline cluster in unmelted exists, or even if a complete melting state is achieved by the energy charging, nucleation will take place preferentially because of a lower nucleation free energy barrier W*, so that a crystal grain 6 grows from such a seed crystal to solidify the surrounding film in a molten phase as shown in FIG. 15(e). FIG. 16(e) shows a temperature distribution in such a state, wherein a latent heat (heat of solidification) is released to the surrounding region at a phase change from molten phase to solid phase whereby the temperature becomes higher in the vicinity of the growth front of the crystal grain 6 in comparison with the surrounding region.

Figure 16F:
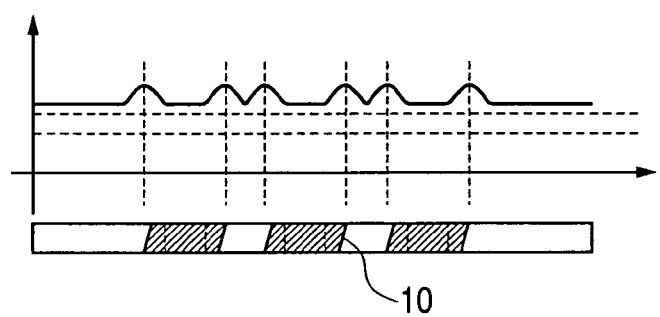

Thereafter, the crystal grain 6 continues to grow, exceeding the specific region 1 and solidifying the contiguous peripheral region as shown in FIG. 16(f). An already crystallized portion is further cooled by heat dissipation to the surrounding region, but a vicinity of the growth front of the crystal grain 6 has a higher temperature in comparison with the surrounding region.

Figure 16G:
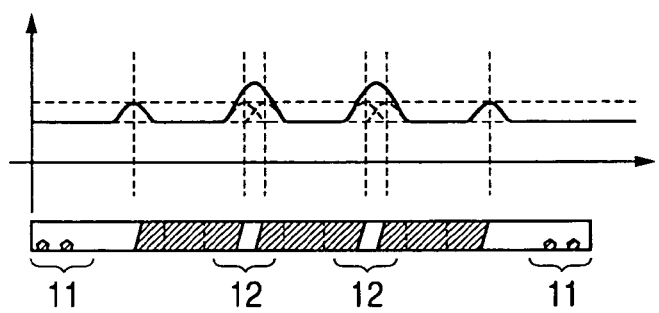

In a region distant from the growth front, because of absence of the release of the latent heat, the temperature lowers after the end of energy charging, and, upon reaching T=Tc−ΔTc (Tc being a melting point of bulk crystal, and ΔTc being the maximum supercooling degree at which spontaneous nucleation would not start), spontaneous nucleation takes place in a random manner. A temperature distribution in such a state is shown in FIG. 16(g).

In a position between two adjacent specific regions 1, in case the interval of the two specific regions is sufficiently small, there is generated a region where overlap a region close to the growth front of a crystal grain growing from a specific region with a region close to the growth front of a crystal grain growing from another specific region, both having a higher temperature than the surrounding region. Even at a time when the temperature in the region 11 distant from the growth front is lowered to Tc−ΔTc, the temperature in such a overlapping region 12 is maintained higher than Tc−ΔTc, because of the overlapping latent heat releases from the growth fronts of the crystal grains growing respectively from the different specific regions 1. Therefore, spontaneous nucleation would not occur in the region 12 and the unsolidified portion remains in a molten phase. As a result, in the region 12, the crystal growth from the specific region 1 continues, thereby a crystal of a larger size is obtained.

Figure 16H:
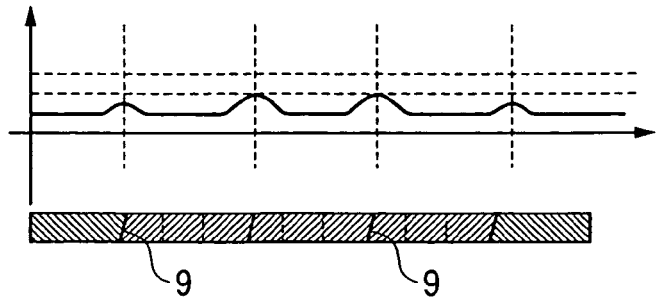

With a further lapse of time, as shown in FIG. 16(h), the growth front of the crystal grain 6 comes in contact with the growth front of an adjacent crystal grain 6, thereby forming a crystal grain boundary 9 and terminating the growth. A growth front having no other crystal grain 6 in the growing direction is hindered by crystalline clusters 11 generated by spontaneous nucleation and is thus stopped.

As explained above, the present invention executes melting and resolidification by giving an energy to a starting film having plural specific regions. The distance or interval between the specific regions is so set that when an unsolidified region distant from a growth front exceeds the supercooling degree of ΔTc in the resolidification of the film, a portion between two specific regions has a temperature of not lower than Tc−ΔTc.

A portion between two specific regions has a temperature of Tc−ΔTc or higher because, at the aforementioned time, a region having a higher temperature than the surrounding region and close to a growth front of the crystal grain growing from a specific region overlaps with a region having a higher temperature than in the surrounding region and close to a growth front of the crystal grain growing from the other specific region whereby such a overlapping portion has a temperature not lower than Tc−ΔTc. Stated differently, the interval of the specific regions is set as such that the temperature of the overlapping portion becomes not lower than Tc−ΔTc during the process.

By arranging the plural specific regions 1 with thus selected predetermined interval or a smaller interval, the growth fronts of the crystal grains growing from the two specific regions mutually contact before the temperature of the aforementioned superposing portion becomes Tc−ΔTc or lower. Thus there is formed a crystalline film in which crystal grains growing from specific regions are in mutual contact. Stated differently, the present invention provides the specific regions in the starting film with such an interval that the growth fronts of the crystal grains growing from the specific regions mutually contact before the time when the temperature of the aforementioned superposing portion becomes Tc−ΔTc or lower.

Thus, the position of each crystal grain is determined by the position of a specific region given in the starting film, so that crystal grains of a uniform size can be obtained by arranging the specific regions with a constant interval.

As explained above, in the present invention, by controlling the interval and the positions of the specific regions, there can be formed a crystalline film by melting and resolidification in which position and density of the crystal grains 6 and the crystal grain boundaries are controlled.

As explained above in detail, the present invention enables easy spatial position control of the crystal grains constituting the crystalline film formed by melting and resolidification, by providing a starting film with specified regions.

Also according to the present invention, control on the interval of the specific regions easily achieves a precise control of the position and the density of crystal grain boundaries in the crystalline film.

[Two-Step Heating]

FIGS. 17(a) to 17(h) show a most basic example of a fourth crystalline film of the present invention and a producing method thereof. In these illustrations, a film is schematically represented as a cross section in a direction perpendicular to a surface of the film or an interface. In the present invention, the film may be in contact with other layers provided above or below, but, in FIGS. 17(a) to 17(h), the film alone is illustrated and such other layers are omitted.

Figure 17A:
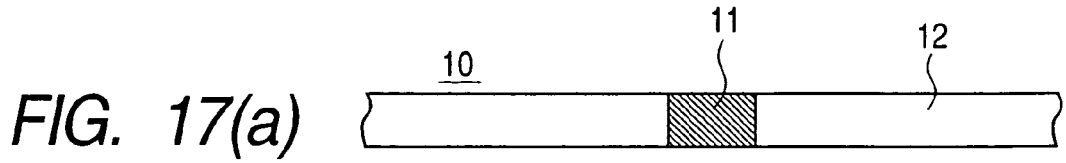
FIGS. 17(a), 17(b), 17(c), 17(d), 17(e), 17(f) and 17(g) show a manufacturing process diagram for explaining a basic embodiment of a fourth crystalline film of the present invention and a producing method thereof.

FIG. 17(a) shows a film before melting and resolidification, namely a starting film.

Figure 17B:
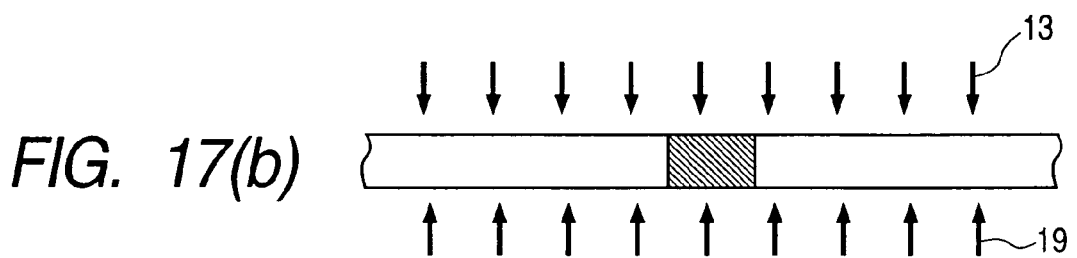

FIG. 17(b) shows a heated state of the starting film.

Figure 17C:
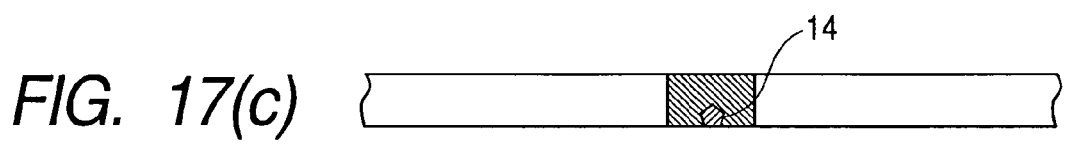

FIG. 17(c) shows the film immediately after the end of energy charging.

Figure 17D:
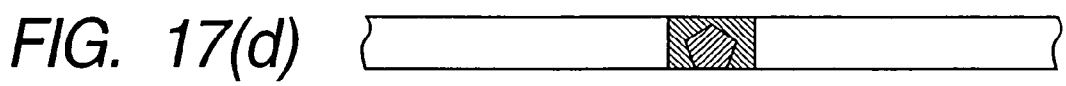

FIG. 17(d) shows the film in an initial stage of resolidification.

Figure 17E:
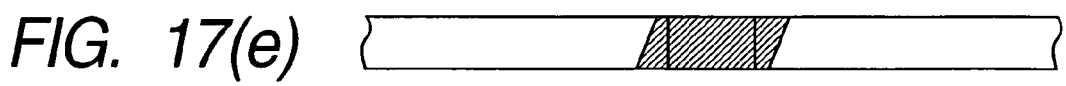

FIG. 17(e) shows the film while resolidification is in progress.

Figure 17F:
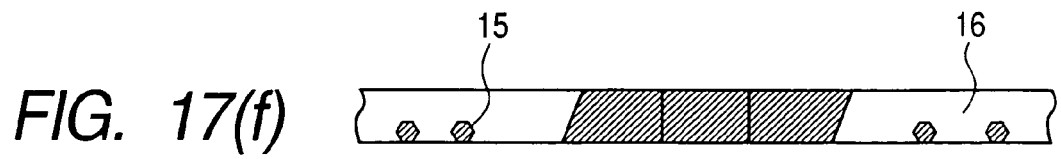

FIG. 17(f) shows the film in a final stage of resolidification.

Figure 17G:
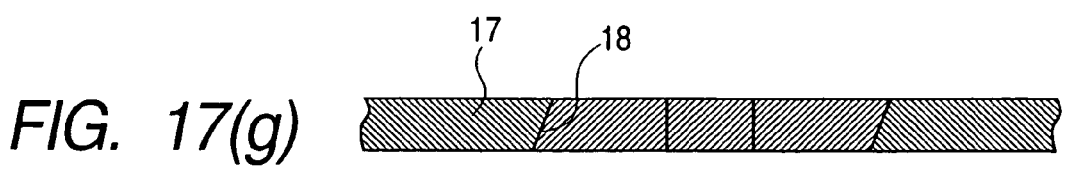

FIG. 17(g) shows the film after the end of resolidification.

In FIGS. 17(a) to 17(g), there are shown a starting film 10, a specific small region 11 having a state different from a peripheral region thereof (hereinafter represented as small region), a peripheral region 12 having a state different from the small region, an energy 13 charged for melting and resolidification, a crystal grain or a crystalline cluster 14, a random crystalline clusters 15, an unsolidified region 16, random crystalline clusters 17, a crystal grain boundary 18, and a heat 19 transferred from the lower layer (substrate) of the film.

First, as shown in FIG. 17(a), there is prepared a starting film 10 having a small region 11 and peripheral region 12 of mutually different states. In the starting film 10, the region 11 is provided in a predetermined specific position, and the peripheral region 12 exists therearound in continuation. A difference in the states of the region 11 and the peripheral region 12 can be provided by irradiation with a particle beam having energy or electromagnetic wave. Film obtained by the aforementioned step (A) or (B) can be used.

The producing method for the crystalline film of this embodiment executes melting and resolidification of the starting film 10 in which such regions of mutually different states co-exist in continuation, and, in such a method, there is required a uniform and precise temperature control as explained later, and a heating process has to be precisely controlled spatially and with time for such a purpose.

In the following, explained are a heating process and means therefor.

The starting film 10 shown in FIG. 17(a) is melted by heating with plural independent heating means. In the embodiment shown in FIGS. 17(a) to 17(g), the heating means provides, as shown in FIG. 17(b), an energy 13 for melting and resolidification and a heat 19 transferred from a substrate.

One of the plural heating means is used for heating in advance the starting film to a temperature not exceeding a melting point. Thereafter the film is further heated by another heating means to reach a molten state. In the embodiment shown in FIGS. 17(a) to 17(g), the heat 19 transferred from the substrate is a heating before melting, and the energy 13 for melting and resolidification constitutes an additional heating.

Specific means of heating can be an irradiation of electromagnetic wave having a wavelength absorbable by the starting film, an irradiation with a particle beam having an energy, a heat conduction by a physical contact to the substrate including the starting film, or a heat generation in the starting film itself by an electrical resistance thereof utilizing a current supply to the starting film or an induction current, or an arbitrary combination of plural independent means. Also the energy provided is not particularly restricted as long as such energy in total can melt the starting film.

Such plural independent heating means can be means for an isothermal heating in which the heating intensity in the melting process does not change with time, means for athermal heating in which the heating intensity in the melting process changes with time, or a combination of independent heating means where at least one is means for isothermal heating, and at least one is means for athermal heating.

The heating means for isothermal heating is heating means having a constant heating intensity not changing with time and capable of providing the film with a constant heat, and is used principally for uniformly heating the film to a predetermined temperature and maintaining it. Such isothermal heating means can be one directly heating the film or one heating the substrate including the film or the susceptor supporting the same to cause heat conduction to the film.

The heating means for athermal heating is heating means having a heating intensity changing with time and capable of providing the film with a predetermined heat within a short time and terminating the heating in a short time, and is used principally for instantaneously melting the film and terminating the heating thereafter for starting cooling. In the process of melting and resolidification of the film, the substrate bearing the film is often made of glass or the like having a melting point lower than that of the film. Accordingly, it is necessary to avoid a situation where the heat for melting the film is transferred to the substrate to elevate the substrate temperature. For this reason, it is preferable to employ heating means for athermal heating capable of heating in a short time, namely having a heating intensity changing with time. Also the heating means having a heating intensity changing with time is preferably of a type for directly heating the film no through the substrate.

It is therefore preferable to employ heating means having a constant heating intensity not changing with time for heating the starting film to a temperature not exceeding the melting point prior to the melting, and heating means having a heating intensity changing with time for melting the film by an additional heating. In such a case, the heating means having a constant heating intensity not changing with time continues to heat the substrate with a constant heating intensity also in the melting step of the film. It is thus possible to melt the film, of which temperature is precisely elevated in advance, by giving a relatively small energy in a pulsed manner, so that a crystalline film by melting and resolidification can be prepared without employing a pulsed laser of a large output.

However, heating means having a constant heating intensity not changing with time can also be used for the aforementioned additional heating if the heating and termination thereof can be switched within a short time. Also the heating means having a heating intensity changing with time can also be used as the heating means for heating the starting film to a temperature not exceeding the melting point as long as it has a sufficiently large output and can heat the film to a predetermined temperature within a short time.

By employing plural heating means for melting the film and terminating the heating thereafter for resolidification, it is possible to suitably combine the change of heating with time of the respective heating means, and to easily achieve a temperature control before, during and after the melting. This is important in the producing method for the crystalline film by melting and resolidifying a starting film in which regions of mutually different states co-exist in continuation, as will be explained in the following.

In the following, a process of melting and resolidification of the film of this embodiment of the present invention is explained.

As shown in FIGS. 17(a) to 17(g), by applying plural independent heating means, namely a heat conduction 19 from the substrate and an energy 13 for melting, the peripheral region 12 is always completely melted, while the small region 11 is completely melted or near completely melted.

In case the small region 11 becomes a near complete melting state, a minimum energy (critical energy) Ec required for melting is controlled to differ inside and outside the small region 11 by making the state of the small region 11 and that of the peripheral region 12 different, so as to satisfy a relationship: "critical energy Ec for peripheral region 12<total energy (13+19) given to the film<critical energy Ec for the small region 11". Thus, after the end of charging of the energy 13 for melting, a crystal grain or a crystalline cluster 14 exists unmelted in the small region 11.

In case the small region 11 becomes a complete melting state, nucleation free energy barrier W* of the small region 11 is controlled by providing different states to the small region 11 and the peripheral region 12 so as to satisfy a relationship: "nucleation free energy barrier W* of the small region 11<nucleation free energy barrier W* of the peripheral region 12". Thus, after the end of charging of the energy 13 for melting and resolidification, a crystal grain or a crystalline cluster 14 is preferentially generated in the small region 11.

In either case, with the progress of cooling of the film thereafter, the small crystal grain or crystalline cluster 14 grows to form a crystal grain 14 [FIGS. 17(c) to 17(d)]. The crystal grain 14 continues growth to reach the surface of the film, and further grows principally in the lateral direction exceeding the small region 11 and into the peripheral region 12 thereof [FIG. 17(e)]. Then, when the film is cooled and supercooling proceeds in the unsolidified region 16 outside the small region, random crystal nuclei 15 are generated at a high rate [FIG. 17(f)]. Then they collide with the crystal grain 14 to form a grain boundary 18 thereof [FIG. 17(g)]. As a result, the present embodiment can form a crystalline film by melting and resolidification in which the position of the crystal grain 14 is defined around the small region 11.

FIGS. 17(a) to 17(g) show an example of growing a single crystal grain 14 from a small region 11, but it is also possible to grow two or more crystal grains 14 of a desired number in the small region 11.

Also FIGS. 17(a) to 17(g) show an embodiment in which the specific region 11 defining the position of the crystal grain 14 is a single domain surrounded by the peripheral region 12. In the present invention, such an embodiment is not restrictive and the small region 11 may be provided in plural units in an uncontinuous and discrete manner. In such a case, when the neighboring small regions 11 are sufficiently separated, random crystalline clusters 17 are positioned between crystal grains 14 grown in respective small regions 11. On the other hand, when the neighboring small regions 11 are sufficiently close, the crystal grains 14 grown in the respective small regions 11 are in direct contact to form the crystal grain boundary 18 without the random crystalline clusters 17 therebetween. Also by regular positioning the small regions 11 with such a distance, it is possible to constitute the entire film with the position-controlled crystal grains 14.

Also the embodiment shown in FIGS. 17(a) to 17(g) shows an example in which the small region 11 and the peripheral region 12 are two-dimensionally provided in a planar direction of the starting film, but, in the present invention, a three-dimensional configuration including a direction of the thickness of the starting film is also possible.

Also the embodiment shown in FIGS. 17(a) to 17(g) shows an example in which the area of the starting film in the planar direction thereof is far larger than at least the small region 11, the crystal grain 14 or the distance between the plural small regions 11. On the other hand, by employing a starting film of a size of the crystal grain 14 as shown in FIGS. 17(a) to 17(g) and by forming a small region 11 surrounded by a peripheral region 12, it is possible that the growth of the crystal grain 14 reaches the entire region of the film before the random crystal nuclei 15 are generated at a high rate in the unsolidified region 16, to obtain a resolidified film constituted solely of the crystal grain 14.

As explained above, the present invention, in the crystalline film formed by melting and resolidification, melts and resolidifies the starting film in which regions of mutually different states co-exist in continuation, employing plural independent heating means, thereby achieving an easy spatial position control of the crystal grain constituting the crystalline film.

The foregoing producing methods for the first to fourth crystalline film of the present invention can exactly and easily control a spatial position of a specific region, so that a crystalline film with a crystal grain formed in a desired position can be obtained. In such methods, by spatially correlating the position of the crystal grain and a specific region of an element or by forming the specific region of an element inside a position-controlled single crystal grain, it is possible to significantly improve the operation characteristics of such an element and to reduce a fluctuation thereof in comparison with a case of employing a prior crystalline film constituted solely of random crystal grains.

Also a circuit constituted by the aforementioned element of the present invention can significantly improve the operation characteristics and reduce the fluctuation thereof in comparison with a circuit constituted of an element employing a prior crystalline film constituted solely of random crystal grains.

Furthermore, an apparatus of the present invention including the circuit of the present invention can significantly improve the operation characteristics, by an improvement in the operation characteristics of such a circuit and a reduction of fluctuation therein. The present invention has an effect of providing an apparatus of a high performance, not achievable in a case of employing a prior crystalline film constituted solely of random crystal grains which are not position controlled.

EXAMPLES

In the following, the present invention will be explained by Examples, but the present invention is not limited by such Examples.

Following Examples 1-1 to 1-6 are examples of the producing method for the first crystalline film of the present invention.

Example 1-1

This Example shows an example of a crystalline silicon film formed by the process of the present invention shown in FIGS. 1(a) to 1(h).

First, on a substrate (not shown) having an amorphous surface containing silicon oxide etc., an amorphous silicon film 3 of a thickness of 55 nm is formed by vapor phase deposition. Then, by dry etching, the amorphous silicon film is removed by 5 nm from the surface, except for a small region 1 of a diameter of about 1 μm in the plane of the amorphous silicon film. Thus the region 1 of a diameter of about 1 μm has a thickness of 55 nm and the other region 2 has a thickness of 50 nm.

Then, the starting film is irradiated with a KrF excimer laser light 4 for 30 nsec with an energy density of about 240 mJ/cm$^2$ to melt the starting film, and the film was resolidified to obtain a crystalline film.

When the crystal grain shape constituting the obtained crystalline film is observed, a single crystal grain of a diameter of about 2 μm grown from the small region of the diameter of about 1 μm is observed, while the peripheral area is filled with fine crystal grains of various sizes, having an average diameter of about 50 nm and being completely random in position.

In the starting film of the present example, the small region 1 of a diameter of about 1 μm is thicker by 5 nm than the other region 2. Presumably the other region is completely melted by the energy of the excimer laser provided for melting, while the small region of the diameter of about 1 μm is in a near complete melting state in which a crystal grain or crystalline cluster remains unmelted.

In the present Example, the thicker small region of the diameter of about 1 μm constitutes a "specific region" shown in FIGS. 1(a) to 1(h), namely a region of a larger thickness formed in a predetermined position with a predetermined dimension or area and with a predetermined interval.

In fact, a real-time observation on a melting-resolidification process of two films of 50 nm and 55 nm thick respectively shows that the former is completely melted while the latter is near completely melted in the aforementioned melting-resolidification conditions.

In the present example, as a result of the growth from a single crystal grain or single crystalline cluster existing in the thicker small region of a diameter of about 1 μm as a seed crystal to a diameter of about 2 μm, there is obtained a crystalline film constituted by crystal grains controlled in spatial positions.

Example 1-2

This Example shows a crystalline silicon film formed by the process shown in FIGS. 2(a) to 2(h).

First, a substrate (not shown) containing silicon oxide etc. and having an amorphous surface is processed to form on the surface a cylindrical crater of about 0.5 μm in diameter and 10 nm in depth by dry etching. Then, an amorphous silicon film 3 of a thickness of 100 nm is formed on the substrate surface by vapor phase deposition. A cross section of the amorphous silicon film is 105 nm thick at the center of a region 1 of about 0.5 μm in diameter, and 100 nm thick in the region 2 other than the region 1.

Then, the starting film 3 is irradiated with XeCl excimer laser light 4 for 40 nsec with an energy density of about 310 mJ/cm$^2$ for melting and resolidification, to obtain a crystalline film.

When the crystal grain shape constituting the obtained crystalline film is observed, a single crystal grain reaching a diameter of 3 μm grown from the small region of the diameter of about 0.5 μm is observed, while the periphery is filled with fine crystal grains of various sizes, having an average diameter of about 50 nm and being completely random in position.

In the starting film of the present example, the small region 1 of a diameter of about 0.5 μm is thicker by 5 nm than the other region 2. It is considered that the region 2 is completely melted by the energy of the excimer laser provided for melting, while the small region of the diameter of about 0.5 μm is in a near complete melting state in which a crystal grain or a crystalline cluster exists unmelted. The thicker small region of the diameter of about 0.5 μm constitutes a "specific region" shown in FIGS. 2(a) to 2(h), namely a region of a larger thickness formed in a predetermined position with a predetermined dimension or area and with a predetermined interval.

In fact, a real-time observation of the melting-resolidification process with two films of which thickness is 100 nm and 105 nm respectively proves that the former is completely melted while the latter is near completely melted under the aforementioned melting-resolidification conditions.

In the present example, as a result of a growth of a single crystal grain or single crystalline cluster existing in the thicker small region of a diameter of about 1 μm as a seed crystal to a diameter of about 3 μm, there is obtained a crystalline film constituted by crystal grains controlled in spatial positions.

Example 1-3

As a third example of the present invention, there is shown a crystalline silicon film formed by steps shown in FIGS. 3(a) to 3(h).

First, on a substrate (not shown) having an amorphous surface of silicon oxide etc., an amorphous silicon film 3 of a thickness of 55 nm is formed by vapor phase deposition. Then, an etching-resistant masking material (not shown) is provided on the surface of a small region of a diameter of about 1.5 μm in the plane of the amorphous silicon film, and the amorphous silicon film is removed by wet etching by 5 nm from the surface. Thus, in the cross section of the amorphous silicon film 3, a region other than the small region 1 of a diameter of about 1.5 μm has a thickness of 50 nm, while the small region 1 of the diameter of about 1.5 μm has a thickness of 55 nm in a region of a diameter of about 0.7 μm at the center, and the thickness gradually decreases from the external periphery to the outside thus forming a truncated conical shape.

Then, the starting film is irradiated with a KrF excimer laser light 4 for 30 nsec with an energy density of about 240 mJ/cm$^2$ for melting and resolidification of the starting film to obtain a crystalline film.

When the crystal grain shape constituting the obtained crystalline film is observed, a single crystal grain reaching a diameter of 2 μm grows from the small region of the diameter of about 1 μm, while the periphery is filled with fine crystal grains of various sizes, having an average diameter of about 50 nm and being completely random in position.

In the starting film of the present Example, the small region 1 of a diameter of about 1.5 μm is thicker by 5 nm than the other region 2. It is considered that the other region is completely melted by the energy of the excimer laser provided for melting, while the small region of the diameter of about 1 μm is in a near complete melting state in which a crystal grain or a crystalline cluster exists unmelted. In the present example, the thicker small region of the diameter of about 1.5 μm constitutes a "specific region" shown in FIGS. 3(a) to 3(h), namely a region of a larger thickness formed in a predetermined position with a predetermined dimension or area and with a predetermined interval.

In fact, a real-time observation on a melting-resolidification process of two films of a uniform thickness of 50 nm and 55 nm respectively proves that the former is completely melted while the latter is near completely melted in the aforementioned melting-resolidification condition.

In the present Example, as a result of a growth of a single crystal grain or single crystalline cluster existing in the thicker small region of a diameter of about 1 μm as a seed crystal to a diameter of about 2 μm, there is obtained a crystalline film constituted by crystal grains controlled in spatial positions.

Example 1-4

As a fourth example of the present invention, there is shown a crystalline silicon film formed by steps shown in FIGS. 4(a) to 4(h).

First, on a substrate (not shown) having an amorphous surface of silicon oxide etc., an etching-resistant masking material (not shown) is provided on the surface except for a small region of a diameter of about 1 μm, and the substrate surface is etched by wet etching by 8 nm, thus forming a crater of an inverted dome shape. Then an amorphous silicon film 3 of a thickness of 100 nm is provided on the surface by vapor phase deposition. In the cross section of the amorphous silicon film 3, a region other than the small region 1 of a diameter of about 1 μm has a thickness of 100 nm, while the small region 1 of the diameter of about 1 μm has a thickness of 105 nm.

The starting film is irradiated with a XeCl excimer laser light 4 for 40 nsec with an energy density of about 310 mJ/cm$^2$ for melting and resolidification of the starting film to obtain a crystalline film.

When the crystal grain shape constituting the obtained crystalline film is observed, a single crystal grain reaching a diameter of 3 μm growing from the small region of the diameter of about 1 μm is observed, while the periphery is filled with fine crystal grains of various sizes, having an average diameter of about 50 nm and being completely random in position.

In the starting film of the present Example, the small region 1 of a diameter of about 1 μm is thicker by 5 nm than the other region. The other region is completely melted by the energy of the excimer laser provided for melting, while the small region of the diameter of about 1 μm is in a near complete melting state in which a crystal grain or a crystalline cluster exists unmelted. In the present example, the thicker small region of the diameter of about 1 μm constitutes a "specific region 1" shown in FIGS. 4(*a*) to 4(*h*). In fact, a real-time observation of a melting-resolidification process with two films of a uniform thickness of 100 nm and 105 nm respectively proves that the former is completely melted while the latter is near completely melted in the aforementioned melting-resolidification condition.

In the present Example, as a result of the growth of a single crystal grain or single crystalline cluster existing in the thicker small region of a diameter of about 1 μm as a seed crystal to a diameter of about 3 μm, there is obtained a crystalline film constituted by crystal grains controlled in spatial positions.

Example 1-5

As a fifth example of the present invention, there is shown a crystalline silicon-germanium film formed by steps shown in FIGS. 1(*a*) to 1(*h*).

First, on a substrate (not shown) having an amorphous surface of an inorganic silicon compound, an amorphous silicon-germanium film 3 of a thickness of 120 nm, having a stoichiometric element composition is formed by a vapor phase deposition. Then, by a dry etching, the amorphous silicon-germanium film is removed by 10 nm from the surface except for a small region of a diameter of about 2 μm in the plane of the amorphous silicon-germanium film to obtain a starting film 3.

Then, the starting film 3 is irradiated with a XeCl excimer laser light 4 for 40 nsec with an energy density of about 280 mJ/cm$^2$ for melting and resolidification of the starting film to obtain a crystalline film.

When the crystal grain shape constituting the obtained crystalline film is observed, a single crystal grain reaching a diameter of about 4 μm growing from the small region of the diameter of about 2 μm is observed, while the periphery is filled with fine crystal grains of various sizes, having an average diameter of about 100 nm and being completely random in position.

In the starting film of the present Example, the small region 1 of a diameter of about 2 μm is thicker by 10 nm than the other region 2. It is considered that the other region is completely melted by the energy of the excimer laser provided for melting, while the small region of the diameter of about 2 μm is in a near complete melting state in which a crystal grain or a crystalline cluster remains unmelted. In the present Example, the thicker small region of the diameter of about 1 μm constitutes a "specific region 1" shown in FIGS. 4(*a*) to 4(*h*).

In fact, a real-time observation of a melting-resolidification process with two films of a uniform thickness of 100 nm and 105 nm respectively proves that the former is completely melted while the latter is near completely melted in the aforementioned melting-resolidification condition.

In the present Example, as a result of the growth of a single crystal grain or single crystalline cluster existing in the thicker small region of a diameter of about 1 μm as a seed crystal to a diameter of about 4 μm, there is obtained a crystalline film constituted by crystal grains controlled in spatial positions.

Example 1-6

As a sixth example of the present invention, there is shown a crystalline germanium film formed by steps shown in FIGS. 2(*a*) to 2(*h*).

First, on a substrate (not shown) provided thereon with a cylindrical crater of a diameter of about 1 μm and a depth of 10 nm in the same manner as in Example 1-2, an amorphous germanium film 3 of a thickness of 200 nm is formed by vapor phase deposition. A cross section of the amorphous germanium film has a thickness of 200 nm in a region 2 other than the small region 1 of the diameter of about 1 μm, and has a thickness of 205 nm at the center of the small region of the diameter of about 1 μm.

Then, the starting film is irradiated with a XeCl excimer laser light 4 for 40 nsec with an energy density of about 330 mJ/cm$^2$ for melting and resolidification of the starting film to obtain a crystalline film.

In an observation of the crystal grain shape constituting the obtained crystalline film, a single crystal grain reaching a diameter of about 5 μm growing from the small region of the diameter of about 1 μm is observed, while the periphery is filled with fine crystal grains of various sizes, having an average diameter of about 80 nm and being completely random in position.

In the starting film of the present Example, the small region 1 of a diameter of about 1 μm is thicker by 5 nm than the other region. It is considered that the other region is completely melted by the energy of the excimer laser provided for melting, while the small region of the diameter of about 0.5 μm is in a near complete melting state in which a crystal grain or a crystalline cluster remains unmelted. The thicker small region of the diameter of about 1 μm constitutes a "specific region" shown in FIGS. 2(*a*) to 2(*h*).

In fact, a real-time observation of a melting-resolidification process with two films of a uniform thickness of 200 nm and 205 nm respectively proves that the former is completely melted while the latter is near completely melted in the aforementioned melting-resolidification condition.

In the present Example, as a result of the growth of a single crystal grain or single crystalline cluster existing in the thicker small region of a diameter of about 1 μm as a seed crystal to a diameter of about 5 μm, there is obtained a crystalline film constituted by crystal grains controlled in spatial positions.

Following Examples 2-1 to 2-4 are examples of an electromagnetic wave irradiation in the second producing methods of crystalline film of the present invention.

Example 2-1

This Example is a first example of a crystalline silicon film formed by the process shown in FIGS. 13(a) to 13(h).

First, on a glass substrate (not shown) having a surface of amorphous silicon oxide, a hydrogenated amorphous silicon film 1 of a thickness of 100 nm is deposited by plasma CVD, and is dehydrogenated by a heat treatment. On the surface of the amorphous silicon film, an amorphous silicon oxide of a thickness of 160 nm is deposited by sputtering, and is patterned by a photolithographic process to form apertures of 1 μm square at square lattice points of a pitch of 5 μm. An irradiation with a KrF excimer laser light 3 of a pulse of a half-peak width of 30 ns is executed with an energy density of about 200 mJ/cm$^{-2}$ from the surface, utilizing the amorphous silicon oxide film as a mask. At this time, most of the laser light is reflected by the amorphous silicon oxide film of 160 nm thick. The amorphous silicon film of a thickness of 100 nm is not melted with an energy density of about 200 mJ/cm$^{-2}$.

Then a starting film 1 is obtained by eliminating the amorphous silicon oxide film used as the mask.

As to the crystallinity of the starting film, crystalline silicon cluster is observed in apertures 4 of 1 μm square provided at the square lattice points of a pitch of 5 μm, provided in the amorphous silicon oxide film, while the other masked region 5 does not have the crystalline silicon cluster and is completely amorphous. Thus, in the aforementioned aperture, there is formed a region having a higher concentration of the crystalline silicon clusters in comparison with the surrounding other region.

Then, the starting film is irradiated with a KrF excimer laser light 6 with an energy density of about 400 mJ/cm$^2$ for melting and resolidification of the starting film to obtain a crystalline film.

In an observation of the crystal grain shape constituting the obtained crystalline film, a single crystal grain reaching a diameter of about 3 μm is observed growing from the region of 1 μm square, positioned at the square lattice points of a pitch of 5 μm, while the periphery is filled with fine crystal grains of various sizes, having an average diameter of about 50 nm and being completely random in position.

In the starting film of the present Example, the aperture of 1 μm square has a higher average value of size distribution and a higher crystalline cluster concentration than in the peripheral region, thus constituting the "specific region 4" and the peripheral region 5" in FIGS. 13(a) to 13(h). Also in the crystalline film after the melting and resolidification, the single crystal grain of a diameter of about 3 μm corresponds to the crystal grain 7 in FIGS. 13(a) to 13(h) and the fine crystal grains in the peripheral region correspond to the crystalline clusters in FIGS. 13(a) to 13(h).

In a real-time observation of a melting-resolidification process with a film irradiated with a KrF excimer laser light with an energy density of about 200 mJ/cm$^2$ and with a non-irradiated film, the former is nearly completely melted while the latter is completely melted in the aforementioned melting-resolidification conditions. This indicates that the melting point of the aperture region becomes higher than the melting point of the peripheral region, namely that the electromagnetic wave irradiation under different conditions generates a difference in the critical energy for complete melting inside and outside the specific region, whereby the critical energy for complete melting in the specific region becomes larger than that in the peripheral region.

Also the aforementioned observation indicates that the energy charged by the excimer laser light in the melting-resolidification process is selected smaller than the critical energy for complete melting in the specific region and larger than the critical energy for complete melting in the peripheral region.

Thus the present Example shows a case in which the electromagnetic wave is a KrF excimer laser light irradiated with an energy density of about 200 mJ/cm$^2$ and not melting the film; the specific region and the peripheral region are set by a mask of an amorphous silicon film wherein the irradiating condition of the electromagnetic wave on both regions is different in an irradiating energy density (about 200 mJ/cm$^{-2}$/0), an irradiating time (30 ns or larger/0), a power density profile with time (pulse of a half-peak width of 30 ns/0), a spectral intensity (a Gaussian distribution around a wavelength 248 nm/0), a coherence (present/absent) and a polarity (finite/0); crystal grain of a desired number (1) grows in the specific region; crystal grain of a desired number (1) growing in the specific region is formed from a crystal grain or a crystalline cluster existing in the specific region at the melting of the film; and a difference in the macroscopic melting point is generated inside and outside the specific region to generate a difference in the size distribution of crystalline cluster concentration inside and outside the specific region of the starting film, thereby controlling a spatial position of at least a part of the crystal grains having a continuous crystalline structure in the crystalline film.

Example 2-2

There is shown a second example of a crystalline silicon film formed by the process shown in FIGS. 13(a) to 13(h).

First, on a substrate (not shown) of fused quartz, an amorphous silicon film 1 of a thickness of 100 nm is deposited by a low pressure CVD. The substrate is mounted on a susceptor having a SiC surface, and the amorphous silicon film is heated to 500° C. by irradiation of an infrared lamp light 2 from an inclined direction. Then a pulsed synchrotron radiation 3 of X-ray region, concentrated to a diameter of 1 μm, is irradiated at every hexagonal lattice point of a pitch of 3 μm on the surface of the amorphous silicon film, to obtain a starting film.

As to the crystallinity of the starting film, crystalline silicon cluster with an average grain size of about 20 nm is observed in the regions 4 of a diameter of about 0.6 μm provided at the hexagonal lattice points of a pitch of 3 μm, irradiated with the irradiation of X-ray, while the average grain size is about 3 nm in the other region 5.

Then, the starting film is irradiated with a XeCl excimer laser light 6 with an energy density of about 360 mJ/cm$^2$ for melting and resolidification of the starting film, to obtain a crystalline film.

The crystal grains constituting the obtained crystalline film have an approximately hexagonal shape, and the film is filled densely with crystal grains with an approximately uniform size, with a distance of 3 μm between the centers of gravity of closest crystal grains. Such crystal grains are growing from the regions irradiated with X-ray.

In the starting film of the present Example, the regions irradiated with X-ray have a size distribution of the crystalline cluster concentration deviated to a larger side in comparison with that in the peripheral region, and each constitutes the "specific region 4" shown in FIGS. 13(a) to 13(h). Thus, the average of the size distribution of concentration of the crystal grains or the crystalline clusters in the specific region is higher than that in the peripheral region thereof.

For reference, in a solid-phase crystallization on the same starting film by an isothermal annealing, a crystal grain grows selectively in the region irradiated by the radiation of the X-ray region. Also in a real-time observation of a melting-resolidification process with a film irradiated with the radiation of the X-ray region and with a non-irradiated film, the former is nearly completely melted while the latter is completely melted.

Thus the present Example shows a case in which the electromagnetic wave is an infrared light and a radiation in the X-ray region; the specific region and the peripheral region are set by the irradiation pattern of the pulsed synchrotron radiation of the X-ray; the radiations of the infrared light and the X-ray region do not melt the film; wherein the irradiating condition on both regions is different in an irradiating energy density (irradiating energy density of infrared light+irradiating energy density of X-ray/irradiating energy density of infrared light only), an irradiating time and a power density profile with time (pulsed light+continuous light/continuous light only), a spectral intensity (a synthesized distribution of infrared region+X-ray region/a distribution of infrared region only), and a coherence and a polarity (present/absent); crystal grain of a desired number (1) grows in the specific region; crystal grain of a desired number (1) growing in the specific region is formed by a crystal grain or a crystalline cluster existing in the specific region at the melting of the film; and a difference in the macroscopic melting point is generated inside and outside the specific region to generate a difference in the size distribution of concentration of crystal grains or crystalline clusters inside and outside the specific region of the starting film, thereby controlling a spatial position of at least a part of the crystal grains having a continuous crystalline structure in the crystalline film.

Example 2-3

In the following there is shown a third example of a crystalline silicon film formed by the process shown in FIGS. 13(a) to 13(h).

First, on a plastic substrate (not shown), an amorphous silicon film 1 of a thickness of 50 nm is deposited by sputtering. Then a laser interference exposure method is employed to irradiate, with an Ar laser light 3, circular regions of an approximately 1 μm diameter arranged on the lattice points of 10 μm pitch on the amorphous silicon film, to obtain a starting film.

As to the crystallinity of the starting film, the region 4 irradiated with the Ar laser light and the peripheral region 5 are both amorphous, but the former has a structural relaxation larger than that of the latter.

Then, the starting film is irradiated with a ArF excimer laser light 6 with an energy density of about 250 mJ/cm² for melting and resolidification of the starting film, to obtain a crystalline film.

In an observation of the crystal grain shape constituting the obtained crystalline film, a single crystal grain reaching a diameter of about 2 μm grows at the circular region 4 of 1 μm diameter positioned at the square lattice points of a 10 μm pitch, while the periphery is filled with fine crystal grains of various sizes, having an average diameter of about 50 nm and being completely random in position.

In the starting film of the present Example, it is anticipated that the circular region of 1 μm diameter irradiated with the Ar laser light has a more advanced structural relaxation than in the peripheral region, thus having a lower nucleation free energy barrier at the solid-phase crystallization. For reference, in a solid-phase crystallization on the same starting film by an isothermal annealing, a crystal grain grows selectively in the region irradiated by the radiation of Ar laser. Also in a real-time observation of a melting-resolidification process on a film irradiated with the radiation of Ar laser and a non-irradiated film, the former is nearly completely melted while the latter is completely melted. Therefore the region irradiated with the Ar laser light constitutes the "specific region 4" in FIGS. 13(a) to 13(h).

Thus the present Example shows a case in which the electromagnetic wave is an Ar laser light; the specific region and the peripheral region are set by an irradiating pattern of the Ar laser light; the irradiation of the Ar laser light does not melt the film; wherein the irradiating condition on both regions is different in an irradiating energy density (finite/0), an irradiating time and a power density profile with time (finite/0), a spectral intensity (a Gaussian distribution around a wavelength 525 nm/0), and a coherence and a polarity (present/absent); crystal grain of a desired number (1) growing in the specific region is formed by a crystal grain or a crystalline cluster existing in the specific region at the melting of the film; and a difference in the macroscopic melting point is generated inside and outside the specific region to generate a difference in the nucleation free energy barrier in the solid-phase crystallization inside and outside the specific region, thereby controlling a spatial position of at least a part of the crystal grains having a continuous crystalline structure in the crystalline film.

Example 2-4

This Example is an example of a crystalline silicon film formed by the process shown in FIGS. 14(a) to 14(h).

First, on a glass substrate (not shown) having a surface of amorphous silicon oxide, a hydrogenated amorphous silicon film of a thickness of 100 nm is deposited by a plasma CVD, and is dehydrogenated by a heat treatment. On the surface of the amorphous silicon film, an amorphous silicon oxide of a thickness of 160 nm is deposited by sputtering, and is patterned to only leave regions of a 3 μm square at square lattice points of a pitch of 5 μm in island shape, thereby forming separated amorphous silicon films 1.

Then an aperture of a 1 μm square is formed at the center of the amorphous silicon oxide film in each island, and an irradiation with a KrF excimer laser light 3 of a pulse of a half-peak width of 30 ns is executed with an energy density of about 200 mJ/cm$^{-2}$, utilizing the amorphous silicon oxide film as a mask. Then the amorphous silicon oxide film is removed and the film 1 is melted and resolidified as in Example 2-1 to obtain a crystalline film.

As to the shape of the crystal grain constituting the obtained crystalline film, the entire film of 3 μm square is constituted of a single crystal grain, and no crystal grain boundary exists.

In this Example, the process of spatial position control for the crystal grains constituting the crystalline film is the same as that in Example 2-1. Also the melting-resolidification forming a film constituted solely of a single crystal grain as in the present Example is applicable also to the crystalline films of Examples 2-2 and 2-3.

Following Examples 2-5 to 2-9 are examples utilizing an irradiation with particles having a mass, in the producing method for the second crystalline film of the present invention.

Example 2-5

This Example is an example of a crystalline silicon film formed by the process shown in FIGS. 13(a) to 13(h).

First, on a glass substrate (not shown) having a surface of amorphous silicon oxide, a hydrogenated amorphous silicon film 1 of a thickness of 100 nm, containing crystalline silicon clusters is deposited by a plasma CVD, and is dehydrogenated by a heat treatment. On the surface of the amorphous silicon film, an amorphous silicon oxide of a thickness of 150 nm (not shown) is deposited by sputtering, and is patterned by a photolithographic process to leave amorphous silicon oxide islands of a 1 μm square at square lattice points of a pitch of 5 μm. From the surface thereof, utilizing the amorphous silicon oxide islands as a mask, silicon ions 2 are implanted with an acceleration energy of 40 keV, a current density of 10 μA and a dose of $4 \times 10^{15}$ cm$^{-2}$. Then the amorphous silicon oxide islands constituting the masks are removed to obtain a starting film 1.

As to the crystallinity of the starting film, in the region 4 of 1 μm square provided at the square lattice points of a pitch of 5 μm, and provided with the amorphous silicon oxide island masks, the amorphous silicon film containing the crystalline silicon clusters after the dehydrogenation process shows no change, while the other region 5 subjected to the silicon ion implanting does not have the crystalline silicon cluster and is completely amorphous. Thus, by the silicon ion implantation, the crystalline cluster vanishes in the unmasked region 5, while the masked region 4 has a higher crystalline cluster concentration and a larger value of the size distribution in comparison with the peripheral region.

Then the starting film is subjected to an irradiation with a KrF excimer laser light 6 of an energy density of about 400 mJ/cm$^{-2}$ for melting and resolidification of the starting film, to obtain a crystalline film.

In an observation of the crystal grain shape constituting the obtained crystalline film, a single crystal grain reaching a diameter of about 3 μm grows at the region of 1 μm square, positioned at the square lattice points of a pitch of 5 μm, while the periphery is filled with fine crystal grains of various sizes, having an average diameter of about 50 nm and being completely random in position.

In the starting film of the present Example, the masked region of 1 μm square has a higher average value of size distribution and a higher concentration of the crystalline clusters than in the peripheral region, thus constituting the "specific region 4" and the peripheral region 5" in FIGS. 13(a) to 13(h). Also in the crystalline film after the melting and resolidification, the single crystal grain of a diameter of about 3 μm corresponds to the crystal grain 7 in FIGS. 13(a) to 13(h) and the fine crystal grains in the peripheral region correspond to the crystalline clusters 10 in FIGS. 13(a) to 13(h). For reference, in a real-time observation of a melting-resolidification process on a film implanted with silicon ions and a non-implanted film, the former is completely melted while the latter is nearly completely melted. This indicates that the macroscopic melting point of the unmasked region becomes lower than the macroscopic melting point of the masked, namely that the silicon ion implantations under different conditions generate a difference in the critical energy for complete melting inside and outside the specific region, whereby the critical energy for complete melting in the specific region becomes larger than that in the peripheral region.

Also the aforementioned observation indicates that the energy charged by the excimer laser light in the melting-resolidification process is selected smaller than the critical energy for complete melting in the specific region and larger than the critical energy for complete melting in the peripheral region.

Thus the present Example shows a case in which the mass particles are silicon ions (ionized silicon atoms); the particle irradiation is ion implantation; the specific region and the peripheral region are set by a mask of an amorphous silicon oxide island; wherein the irradiating condition on both regions is different in a kind of particles (silicon atoms/none), a state (whether ionized kinetic energy is 40 keV or 0, and whether current density is 10 μA or 0); and an irradiation amount (dose of $4 \times 10^{15}$ cm$^{-2}$ or 0); crystal grain of a desired number (1) grows in the specific region; crystal grain of a desired number (1) growing in the specific region is formed by a crystal grain or a crystalline cluster existing in the specific region at the melting of the film; and a difference in the macroscopic melting point is generated inside and outside the specific region by generating a difference in the size distribution of crystalline cluster concentration inside and outside the specific region of the starting film, thereby controlling a spatial position of at least a part of the crystal grains having a continuous crystalline structure in the crystalline film.

Example 2-6

This Example also shows an example of a crystalline silicon film formed by the process shown in FIGS. 13(a) to 13(h).

First, on a substrate (not shown) of fused quartz, an amorphous silicon film 1 of a thickness of 100 nm is deposited by a low pressure CVD, and monovalent silicon ions 2, 3 are uniformly implanted from the surface over the entire film with an acceleration energy of 40 keV, and a dose of $2 \times 10^{14}$ cm$^{-2}$. Then a focused beam drawing method is used to implant divalent silicon ions 2 with an acceleration energy of 80 keV, and a dose of $2 \times 10^{15}$ cm$^{-2}$. The implantation is executed by blanking the focused ion beam so as not to irradiate the focused ion beam 2 in regions of a 0.5 μm square at hexagonal lattice points of a pitch of 2.5 μm.

Then, the starting film is irradiated with a XeCl excimer laser light 6 with an energy density of about 360 mJ/cm$^2$ for melting and resolidification of the starting film, to obtain a crystalline film.

In an observation of the obtained crystalline film, the film is hexagonally densely filled with crystal grains with an approximately uniform size, with a distance of 2.5 μm between the centers of gravity of closest crystal grains. Such crystal grains grow from the regions 4 of 0.5 μm square not irradiated with the focused ion beam 2 of the divalent silicon ions.

In the amorphous silicon film 1 deposited by low pressure CVD, it is known that, when the particles reach the vicinity of the interface with the substrate by ion implantation, a modification of the vicinity of the interface increase the nucleation free energy barrier W* in solid-phase crystallization. Therefore, in the film of the present Example, the region 4 of 0.5 μm square not irradiated with the focused ion beam 2 of the divalent silicon ions is considered to show a smaller modification of the vicinity of the interface with the substrate than in the peripheral region 5, thus having a smaller W*, and these regions respectively constitute the "specific region 4" and the "peripheral region 5" in FIGS. 13(a) to 13(h). For reference, in a solid-phase crystallization on the same film by an isothermal annealing, a crystal grain grows selectively in the region of 0.5 μm square. Also in a melting-resolidification process on a film irradiated with the focused ion beam 2 of the divalent silicon ions after the uniform ion implantation and a non-irradiated film, the former is completely melted while the latter is nearly completely melted.

Thus the present Example shows a case in which the mass particles are silicon ions (ionized silicon atoms); the particle irradiation is ion implantation and an irradiation with a focused ion beam; the specific region and the peripheral region are set by an irradiation with a focused ion beam; wherein the irradiating condition on both regions is different in a state (whether ions are monovalent or divalent, and whether kinetic energy is 40 keV or 80 keV); and an irradiation amount (dose of $2\times10^{14}$ cm$^{-2}$ or $4\times10^{15}$ cm$^{-2}$); crystal grain of a desired number (1) grows in the specific region; crystal grain of a desired number (1) growing in the specific region is formed by a crystal grain or a crystalline cluster existing in the specific region at the melting of the film; a difference in the macroscopic melting point is generated inside and outside the specific region; and a difference is generated in the interfacial state of the film with the substrate inside and outside the specific region to generate a difference in the nucleation free energy barrier in solid-phase crystallization inside and outside the specific region, thereby controlling a spatial position of at least a part of the crystal grains having a continuous crystalline structure in the crystalline film.

Example 2-7

This Example shows still another example of a crystalline silicon film formed by the process shown in FIGS. 13(*a*) to 13(*h*).

First, on a plastic substrate (not shown), an amorphous silicon film 1 of a thickness of 50 nm is deposited by sputtering. Then a focused ion beam drawing method is employed to implant divalent tin ions 3 under conditions of an acceleration energy of 110 keV and a dose of $1\times10^{15}$ cm$^{-2}$ in regions 4 of a 0.5 μm square at square lattice points of a pitch of 10 μm.

Then, the starting film is irradiated with an ArF excimer laser light 6 with an energy density of about 250 mJ/cm$^2$ for melting and resolidification of the starting film, to obtain a crystalline film.

In an observation of the crystal grain shape constituting the obtained crystalline film, a single crystal grain reaching a diameter of about 2 μm grows at the region 4 of a 0.5 μm square, positioned at the square lattice points of a pitch of 10 μm, while the periphery is filled with fine crystal grains of various sizes, having an average diameter of about 50 nm and being completely random in position.

In the film of the present Example, tin is contained only in the region of 0.5 μm square, constituting the "specific region" shown in FIGS. 13(*a*) to 13(*h*). An impurity such as tin reduces the nucleation free energy barrier in the melting and resolidification of silicon. For reference, in a real-time observation of melting and resolidification of a film implanted with tin ions and a non-implanted film, both films melted completely under the same melting-resolidification conditions but the former solidified more rapidly in the resolidifying step.

As a result, this Example shows that the crystal grain or the crystalline cluster of a desired number growing in the specific region of the film is a crystal grain or a crystalline cluster formed by nucleation from the molten phase in the resolidifying step of the film after the melting, that a difference in the nucleation free energy barrier in the solidification from the molten phase inside and outside the specific region occurs by tin ion implantation in the specific region, namely that the nucleation free energy barrier in the melting-resolidification in the specific region is smaller than the nucleation free energy barrier in the melting-resolidification in the other region.

Thus the present Example shows a case in which the particles having a mass are tin ions (ionized tin atoms or cluster); the irradiation of particles is an irradiation of a focused ion beam; the specific region and the peripheral region are set by an irradiation of a focused ion beam; wherein the irradiating condition on both regions is different in a kind of particles (tin atoms or cluster/none), a state (whether kinetic energy is 110 keV or 0); and an irradiation amount (dose of $1\times10^{15}$ cm$^{-2}$ or 0); crystal grain of a desired number (1) grows in the specific region; crystal grain of a desired number (1) growing in the specific region is formed by a crystal grain or a crystalline cluster formed by nucleation from a molten phase in a resolidification step of the film after melting; a difference is generated in an element composition ratio or an impurity concentration inside and outside the specific region, a difference is generated in the nucleation free energy barrier in the solidification from the molten phase inside and outside the specific region is generated inside and outside the specific region; thereby controlling a spatial position of at least a part of the crystal grains having a continuous crystalline structure in the crystalline film.

Example 2-8

This Example shows still another example of a crystalline silicon film formed by the process shown in FIGS. 13(*a*) to 13(*h*).

First, on a glass substrate (not shown), an amorphous silicon film 1 of a thickness of 80 nm is deposited by electron beam evaporation. Then a masked evaporation method is employed to deposit nickel by vacuum evaporation with a thickness of about 10 atom layers only in regions of a 3 μm square at square lattice points of a pitch of 20 μm.

Then, the starting film is irradiated with a KrF excimer laser light 6 with an energy density of about 300 mJ/cm$^2$ for melting and resolidification of the starting film, to obtain a crystalline film.

In an observation of the crystal grain shape constituting the obtained crystalline film, a single crystal grain reaching a diameter of about 5 μm grows at the region 4 of a 3 μm square, positioned at the square lattice points of a pitch of 20 μm, while the periphery is filled with fine crystal grains of various sizes, having an average diameter of about 50 nm and being completely random in position.

In the starting film of the present Example, nickel is adsorbed only in the region of 3 μm square, constituting the "specific region" shown in FIGS. 13(*a*) to 13(*h*). A surface adsorption of a metal such as nickel reduces the nucleation free energy barrier at the solid-phase crystallization of amorphous silicon. For reference, in a real-time observation of melting and resolidification of a film evaporated with nickel and a non-evaporated film, the former shows incomplete melting under the aforementioned melting-resolidification conditions but the latter shows complete melting.

These results indicate that a macroscopic melting point becomes higher in the specific region than in the peripheral region by the nickel adsorption in the specific region, namely a difference is generated in the critical energy for complete melting inside and outside the specific region whereby the critical energy for complete melting in the specific region becomes larger than the critical energy for complete melting in the peripheral region.

Also this observation confirms that the energy charged by excimer laser in the melting-resolidification process is smaller than critical energy for complete melting in the specific region and larger than the critical energy for complete melting in the peripheral region.

Thus the present Example shows a case in which the particles having a mass are nickel atoms or cluster; the irradiation of particles is a vacuum evaporation; the specific region and the peripheral region are set by a masked evaporation pattern; wherein the irradiating condition on both regions is different in a kind of particles (nickel atoms or cluster/none); and an irradiation amount (an evaporation thickness of 10 atomic layers or 0); crystal grain of a desired number (1) grows in the specific region; crystal grain of a desired number (1) growing in the specific region is formed by a crystal grain or a crystalline cluster existing in the specific region at the melting of the film; a difference in the macroscopic melting point is generated inside and outside the specific region and a difference is generated in the surface adsorbed substance inside and outside the specific region of the film to generate a difference in the nucleation free energy barrier in solid-phase crystallization inside and outside the specific region, thereby controlling a spatial position of at least a part of the crystal grains having a continuous crystalline structure in the crystalline film.

Example 2-9

This Example shows still another example of a crystalline silicon film formed by the process shown in FIGS. 13(a) to 13(h).

First, on a glass substrate (not shown) having a surface of amorphous silicon oxide, a hydrogenated amorphous silicon film 1 of a thickness of 100 nm, not containing crystalline silicon clusters, is deposited by a plasma CVD, and is dehydrogenated by a heat treatment. On the surface of the amorphous silicon film, an amorphous silicon oxide film of a thickness of 3 μm (not shown) is deposited by TEOS method, and is patterned by a photolithographic process to form apertures of a 2 μm square at square lattice points of a pitch of 10 μm. From the surface thereof, utilizing the amorphous silicon oxide layer as a mask, Xe ions 3 are implanted under conditions of an acceleration energy of 1 MeV, and a dose of $1 \times 10^{16}$ $cm^{-2}$. Then the amorphous silicon oxide film constituting the mask is removed to obtain a starting film 1. As to the crystallinity of the starting film, in the aperture 4 of 2 μm square provided at the square lattice points of a pitch of 10 μm, a crystalline cluster is present by an ion beam-induced crystallization, while the other region 5 is free from the crystalline silicon cluster and is completely amorphous.

Then the starting film is subjected to an irradiation with a KrF excimer laser light of an energy density of about 380 $mJ/cm^{-2}$ for melting and resolidification of the starting film, to obtain a crystalline film.

In an observation of the crystal grain shape constituting the obtained crystalline film, a single crystal grain reaching a diameter of about 3 μm grows at the region of 2 μm square, positioned at the square lattice points of a pitch of 10 μm, while the periphery is filled with fine crystal grains of various sizes, having an average diameter of about 50 nm and being completely random in position.

In the starting film of the present Example, the aperture 4 of 2 μm square provided in the amorphous silicon oxide film has a higher average value of size distribution and a higher concentration of the crystalline cluster concentration than in the peripheral region, thus constituting the "specific region 4" and the peripheral region 5" in FIGS. 13(a) to 13(h). Also in the crystalline film after the melting and resolidification, the single crystal grain of a diameter of about 3 μm corresponds to the crystal grain 7 in FIGS. 13(a) to 13(h) and the fine crystal grains in the peripheral region correspond to the crystalline clusters in FIGS. 13(a) to 13(h). For reference, in a real-time observation of a melting-resolidification process on a film implanted with Xe ions and a non-implanted film, the former is incompletely melted while the latter is completely melted in the aforementioned melting-resolidification condition.

Thus the present Example shows a case in which the mass particles are Xe ions (ionized Xe atoms); the particle irradiation is ion implantation; the specific region and the peripheral region are set by an aperture in an amorphous silicon oxide island; wherein the irradiating condition on both regions is different in a kind of particles (Xe atoms/none), a state (whether ionized, whether kinetic energy is 1 MeV or 0); and an irradiation amount (dose of $1 \times 10^{16}$ $cm^{-2}$ or 0); crystal grain of a desired number (1) grows in the specific region; crystal grain of a desired number (1) growing in the specific region is formed by a crystal grain or a crystalline cluster existing in the specific region at the melting of the film; and a difference in the macroscopic melting point is generated inside and outside the specific region by generating a difference in the size distribution of crystalline cluster concentration inside and outside the specific region of the starting film, thereby controlling a spatial position of at least a part of the crystal grains having a continuous crystalline structure in the crystalline film.

Example 2-10

As an example of the present invention, there is shown an example of a MOS type TFT element, a TFT integrated circuit and an electroluminescence (EL) display apparatus having a structure shown in FIG. 12.

First, by a process shown in Example 2-4, a single silicon crystal grain of a 3 μm square is provided on a glass substrate on which a silicon nitride film and a silicon oxide film are laminated. Then, according to an ordinary low-temperature forming process for a silicon thin film transistor, a gate insulation film and a gate electrode film of silicon oxide are deposited, and the gate electrode film is removed except for a region of a width of 1 μm at the center of the single crystal grain. Then boron is doped in other regions by a self alignment method utilizing the remaining gate electrode film as a mask, thereby forming a gate area, a source area and a drain area by activating the dopant. Thus the entire gate area is included inside the single crystal grain. Thereafter a passivation layer formed by an insulating film is deposited, and an aperture is formed in the passivation layer on each region. Finally an aluminum wiring layer is deposited and is patterned to form a gate electrode, a source electrode and a drain electrode to obtain a MOS TFT.

The obtained MOS TFT has operation characteristics functioning twice or more faster in an average value of mobility, in comparison with an element formed by the same process and the same shape on a random polycrystalline film without the "specific region 4". Also a fluctuation in the element characteristics is reduced to about a half in mobility and to about ¼ in a threshold voltage.

Then two adjacent MOS TFTs are connected in the following manner. A drain electrode of a first TFT is connected to a gate electrode of a second TFT, and a gate electrode of the second TFT is connected through a capacitor element to a source electrode thereof. In this manner an integrated circuit is formed by two TFTs and the capacitor element. In this circuit, a drain output of a source current supplied to the source of the second TFT is controlled by an accumulating capacitance of the capacitor element, and an accumulation capacitance of the capacitor element and an accumulation switching are controlled by a gate voltage of the first TFT. This circuit can be utilized for example in an element circuit for switching and current control of each pixel in an active matrix display apparatus.

Basic operation characteristics measured on the circuit formed in the present Example, in comparison with those of a circuit formed by the same process and the same shape on a random polycrystalline film without the "specific region 4", provide an operable switching frequency of 3 times or higher, and a controllable range, expanded about twice, of the current outputted from the drain electrode of the second TFT. Also in comparison of the characteristics of same circuits formed in plurality, the fluctuation is reduced to about a half or less. This means that not only the first TFT and the second TFT in each circuit but also the relative characteristics of the first TFT and the second TFT in each circuit are more uniform with respect to the objects of comparison.

Then such a TFT integrated circuit positioned at each square lattice point on a glass substrate with a pitch of 100 μm is employed as an element circuit, and following wirings are provided on the element circuit in order to constitute a pixel of an image display apparatus by such a unit of the square lattice. First a scan line running in an axial direction of the square lattice is provided for each lattice, and the gate electrode of the first TFT in each element circuit is connected thereto. On the other hand, in a direction perpendicular to the scan line, a signal line and a power supply line are provided for each lattice, and the source electrode of the first TFT and the source electrode of the second TFT are respectively connected thereto. Then, on the integrated circuits of such an element circuits, there is deposited an insulation layer, and an aperture is formed therein to expose the drain electrode of the second TFT of each element circuit. Then a metal electrode is deposited and is separated for each pixel. Finally an electroluminescence (EL) emission layer and an upper transparent electrode layer are laminated. In this manner there is constituted an active matrix multi-gradation EL image display apparatus in which the TFT integrated circuit executes switching and an injected current control for each pixel.

In this EL display apparatus, a charge amount corresponding to a current given to the signal line by an activation of the first TFT corresponding to a voltage in the scan line is accumulated from the power supply line to the capacitor element, and a current controlled by a gate voltage of the second TFT corresponding to such accumulated charge is injected from the power supply line to the EL light emission layer.

Basic operation characteristics measured on the image display apparatus formed in the present Example, in comparison with those of an image display apparatus formed by the same process and the same shape on a random polycrystalline film without the "specific region 4", provide, in static characteristics, a maximum luminance and a maximum contrast increased about twice and a gradation reproducing range expanded by about 1.5 times. Also a pixel defect rate and a brightness unevenness are respectively reduced to ⅓ and ½. Also in dynamic characteristics, a maximum frame rate is increased about twice. Such improvements in the operation characteristics are derived from an improvement and a reduction in fluctuation of the characteristics of the element circuit, and are further derived from an improvement and a reduction in fluctuation of the characteristics of the thin film transistor constituting each element circuit, and are therefore an effect that the active area of such a thin film transistor is formed within a single crystal grain.

Example 3

This Example shows an example of a producing method for the third crystalline film of the present invention, shown in FIGS. 15(a) to 15(h). In the following reference is made to FIGS. 15(a) to 15(h) for explanation.

First, on a substrate (not shown) having an amorphous surface for example of silicon oxide, an amorphous silicon film 3 of a thickness of 100 nm including crystalline silicon clusters is formed by a vapor phase deposition. Then silicon ions (not shown) are irradiated locally from the surface of the amorphous silicon film 3 including crystalline silicon clusters. In this operation, small regions 1 of a diameter of about 1 μm not irradiated with the silicon ions are periodically positioned on square lattice points of a pitch of 2 μm. In this manner partial regions in the amorphous silicon film including crystalline silicon clusters are made amorphous to obtain a starting film.

Then, the starting film is irradiated with a KrF excimer laser light 4 for 30 nsec with an energy density of about 360 mJ/cm$^2$ for melting and resolidification of the starting film, to obtain a crystalline film.

As to the crystal grain shape constituting the obtained crystalline film, a single crystal grain of a diameter of 2 μm grows at each lattice point of a square lattice of a pitch of 2 μm, and these single crystal grains are adjoined at the growth fronts to form a crystal grain boundary 9. The region other than the regions constituting the square lattice points is filled with fine crystal grains 8 of various sizes, having an average diameter of about 50 nm and being completely random in position.

In the starting film of the present Example, the small region 1 of a diameter of about 1 μm not irradiated with the energy beam has a higher average value of size distribution and a higher concentration of the crystalline cluster concentration than in the other region 2. Such difference in the size distribution of the crystalline cluster concentration causes a difference in the states of the regions continuous in the starting film, whereby the small region of the diameter of about 1 μm constitutes the "specific region 1" in FIGS. 15(a) to 15(h). In a comparison of a melting-resolidification process on a film irradiated with silicon ions and a non-irradiated film, it is observed that the former is completely melted while the latter is incompletely melted in the aforementioned melting-resolidification condition.

Also in this Example, plural "specific regions 1" are positioned in a square lattice shape of a pitch of 2 μm. Thus there is generated a region where latent heats generated from the growth fronts of the crystal grains 6 growing from the adjacent specific regions 1 overlap. Such a region has a temperature higher higher than Tc−ΔT, at a time when a region not receiving the release of the latent heat reaches a temperature Tc−ΔT (temperature causing spontaneous nucleation). Also before the temperature of the overlapping region becomes lower than Tc−ΔT, namely before spontaneous nucleation is generated in such a region, the growth fronts of the crystal grains 6 growing from the adjacent specific regions 1 mutually contact to form a crystal grain boundary. As a result, the present Example provides a crystalline film in which position and density of crystal grain boundaries are controlled.

Following Examples 4-1 to 4-3 are examples of producing methods for the fourth crystalline film of the present invention.

Example 4-1

Figure 18:
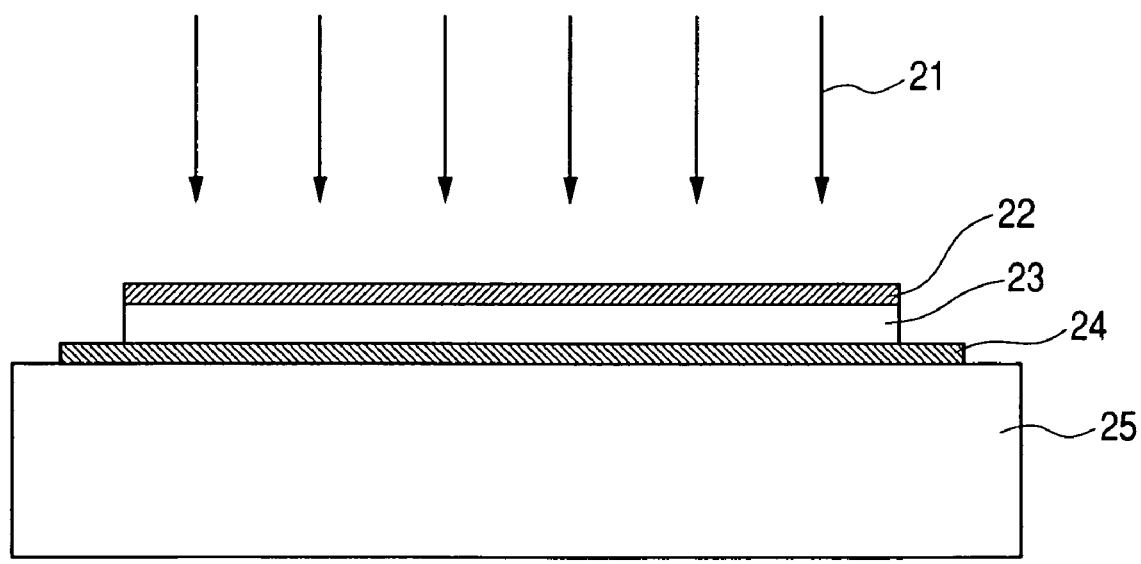
FIG. 18 shows a manufacturing process diagram for explaining a first example of a fourth crystalline film of the present invention and a producing method thereof.

FIG. 18 is a cross sectional view of a crystalline silicon film formed by the process shown in FIGS. 17(a) to 17(g). In the following, steps of FIGS. 17(a) to 17(g) will be explained.

First, on a glass substrate 23 having a surface of amorphous silicon oxide, a hydrogenated amorphous silicon film 22 of a thickness of 100 nm, containing crystalline silicon clusters, is deposited by a plasma CVD, and is dehydrogenated by a heat treatment. On the surface of the amorphous silicon film, an amorphous silicon oxide of a thickness of 150 nm (not shown) is deposited by sputtering, and is patterned by a photolithographic process to leave amorphous silicon oxide islands of a 1 μm square at square lattice points of a pitch of 5 μm. From the surface thereof, utilizing the amorphous silicon oxide islands as a mask, silicon ions (not shown) are implanted with an acceleration energy of 40 keV, a current density of 10 μA and a dose of $4 \times 10^{15}$ cm$^{-2}$. Then the amorphous silicon oxide islands constituting the masks are removed to obtain a starting film 22 (10 in FIGS. 17(a) to 17(g)). As to the crystallinity of the starting film, in the region (11 in FIGS. 17(a) to 17(g)) of 1 μm square provided at the square lattice points of a pitch of 5 μm, and provided with the amorphous silicon oxide island masks, the amorphous silicon film containing the crystalline silicon clusters after the dehydrogenation process shows no change, while the other region (12 in FIGS. 17(a) to 17(g)) subjected to the silicon ion implanting does not have the crystalline silicon cluster and is completely amorphous.

The glass substrate 23 bearing the starting film 22 is placed on a susceptor 24, which is heated to 400° C. by an induction heating apparatus 25 thereby heating the starting film as shown by 19 in FIG. 17(b). After the starting film is thus maintained at a constant temperature, a CW laser beam 21 (13 in FIG. 17(b)) of a constant output is irradiated for a predetermined time in consideration of the air temperature and the heat capacity of the glass substrate 23, thereby melting and resolidifying the starting film 22 and obtaining a crystalline film.

As to the crystal grain shape constituting the obtained crystalline film, a circular single crystal grain reaching a diameter of about 3 μm grows at the region of 1 μm square (11 in FIGS. 17(a) to 17(g)), positioned at the square lattice points of a pitch of 5 μm, while the periphery is filled with fine crystal grains of various sizes, having an average diameter of about 50 nm and being completely random in position.

In the present Example, there is employed a starting film 22 in which the small region (11 in FIGS. 17(a) to 17(g)) and the peripheral region (12 in FIGS. 17(a) to 17(g)) are rendered in mutually different states by a silicon ion irradiation, and the susceptor 24 maintained at a constant temperature and the CW laser 21 of a constant output are employed for providing the starting film 22 with an energy for melting and resolidification. The susceptor 24 constitutes heating means for transmitting heat to the film through the substrate thereby heating the film to a temperature not exceeding the melting point, and the carbon dioxide gas laser 21 constitutes heating means for heating thus heated film thereby melting the film.

Thus the present Example shows an example of a producing method for the crystalline film, including a step of heating the film to a temperature not exceeding the melting point by heat conduction from the substrate, a step of heating thus heated film thereby melting the film by an additional energy charging for a predetermined time, and a step of resolidification after the end of the additional energy charging.

A pulsed laser may be employed instead of CW laser of fixed output. For example the crystalline film can be obtained by heating the susceptor 24° C. to 400° C. by a hot plate 25, and, while this temperature is maintained, melting and resolidifying the starting film 22 with a KrF excimer laser 21 of a pulse width of about 30 nsec.

In such a case, the excimer pulsed laser 21 constitutes heating means having an athermal process having a change with time of heating intensity in the melting process of the starting film, thereby melting the film heated to immediately below the melting point by the susceptor or the like.

Example 4-2

Figure 19A:
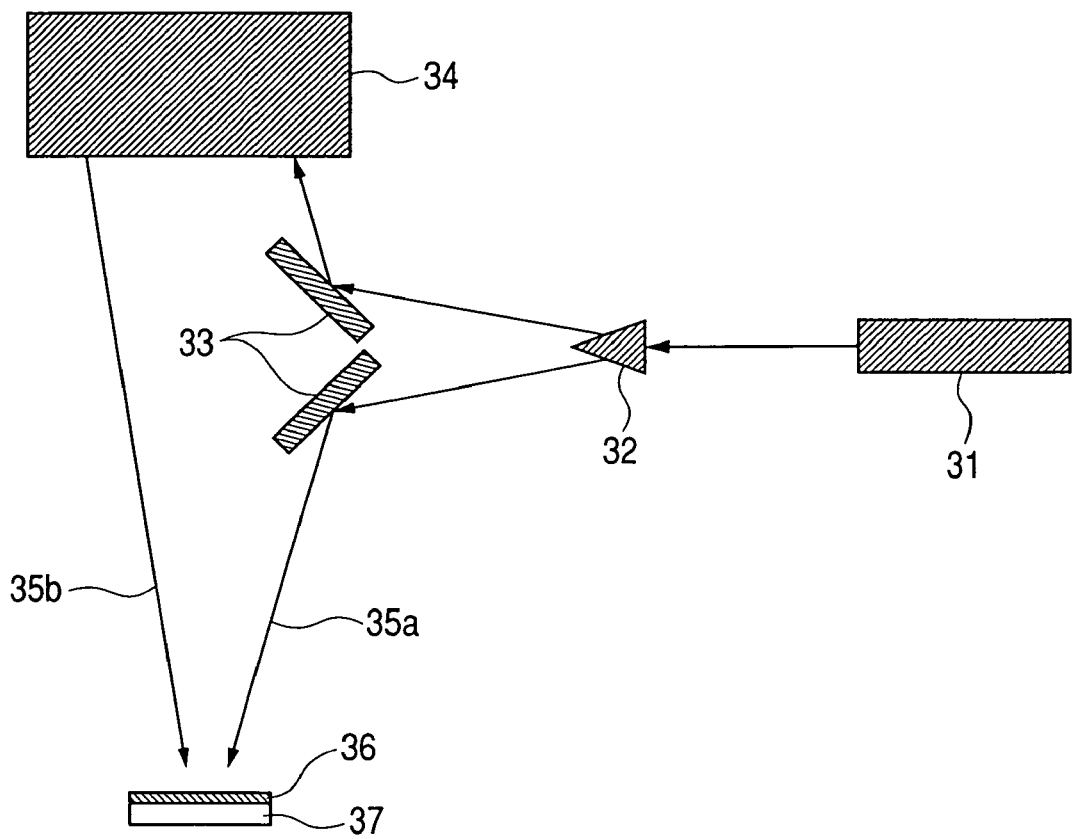
FIGS. 19(a) and 19(b) show a manufacturing process diagram for explaining a second example of a fourth crystalline film of the present invention and a producing method thereof.
Figure 19B:
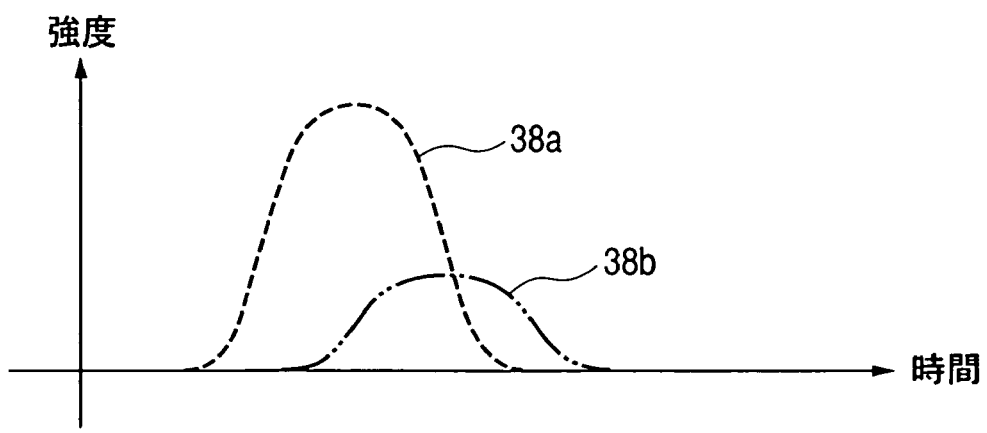

A second example of the crystalline silicon film formed by the process shown in FIGS. 17(a) to 17(g)) will be explained with reference to FIGS. 19(a) and 19(b).

First there is prepared, on a substrate 37, a silicon starting film 36 in which a small region and a peripheral region are made in mutually different states under conditions same as in Example 4-1.

Then a KrF excimer laser 31 of a pulse width of about 30 nsec is employed for melting and resolidifying the starting film 36. A beam splitter 32 is provided in an optical path from the KrF excimer laser 31 to the starting film 36, for splitting the laser light into a laser light A 35a and a laser light B 35b, and the laser light A 35a is set in an optical path of a shortest distance while the laser light B 35b is set in an optical path longer by about 10 m than the laser light A 35a by an optical path extending apparatus 34 to executes an irradiation on the same position on the starting film 36, thereby melting and resolidifying the starting film 36 to obtain a crystalline film. The energy density is regulated at a total pulse output capable of melting the starting film 36, in consideration of conditions such as an air temperature and a heat capacity of the glass substrate. The light irradiating the sample is a sum of an intensity profile 38a of the laser light A and an intensity profile 38b of the laser light B as shown in FIG. 19(b), and has an intensity profile asymmetrical with time.

As to the crystal grain shape constituting the obtained crystalline film, a circular single crystal grain reaching a diameter of about 3 μm grows at the region of 1 μm square positioned at the square lattice points of a pitch of 5 μm, while the periphery is filled with fine crystal grains of various sizes, having an average diameter of about 50 nm and being completely random in position, as in Example 4-1.

In the present Example, there is employed a starting film 36 in which the small region and the peripheral region are rendered mutually different by a silicon ion irradiation, and, as plural independent means for providing the starting film with energy, separated waves with different optical paths of the same pulsed laser are employed with a time difference to irradiate the film with two pulses of different intensities. As a result, the film is given a change in the heating intensity asymmetrical with time, thus realizing a preferable profile of temperature change.

Example 4-3

Figure 20:
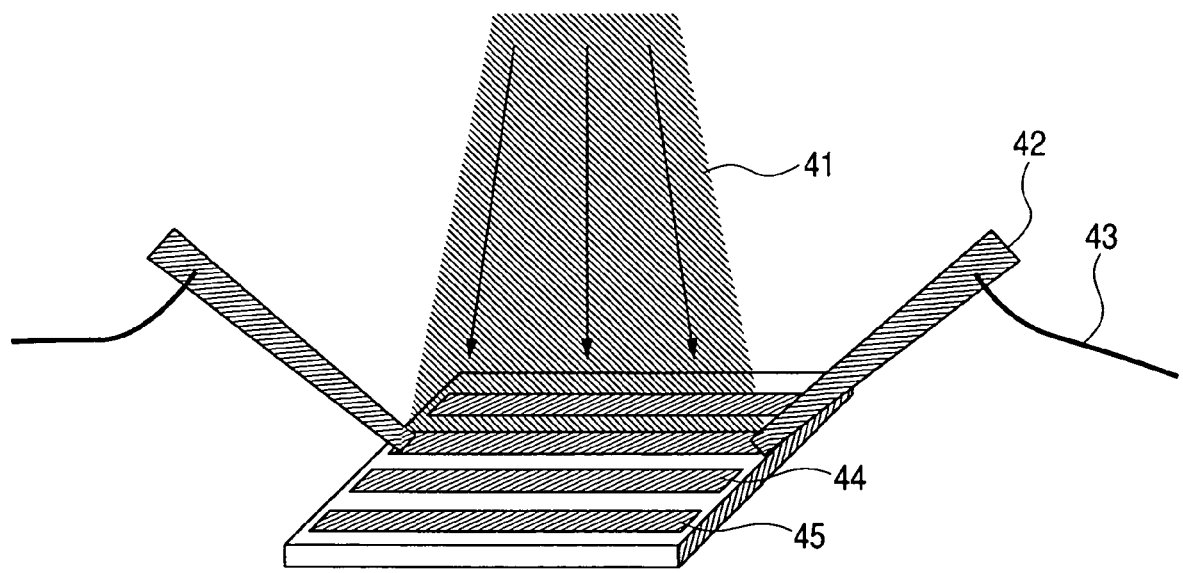
FIG. 20 shows a manufacturing process diagram for explaining a third example of a fourth crystalline film of the present invention and a producing method thereof.
Figure 21A:
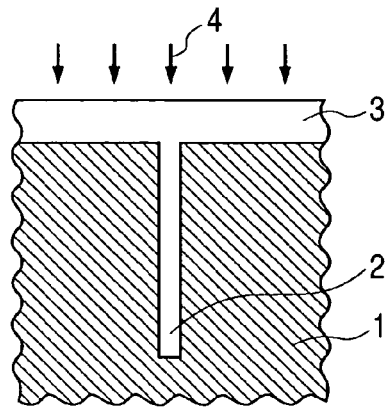
FIGS. 21(a), 21(b), 21(c), 21(d), 21(e) and 21(f) show a manufacturing process diagram for explaining a prior crystalline film and a producing method thereof.
Figure 21D:
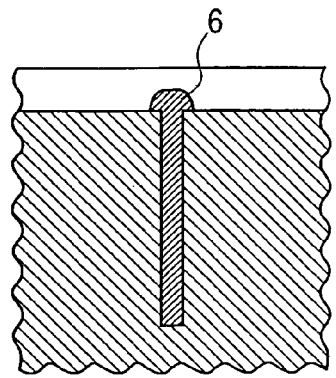
Figure 21B:
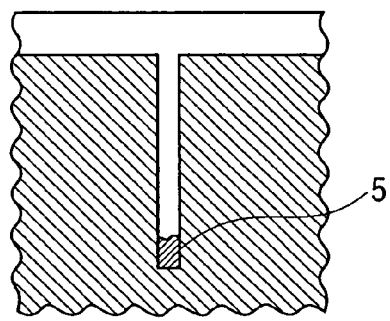
Figure 21E:
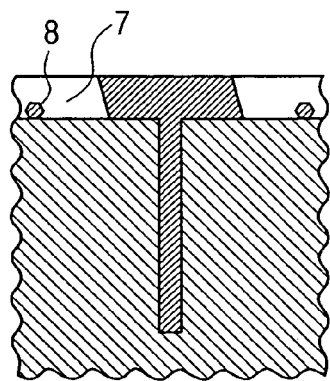
Figure 21C:
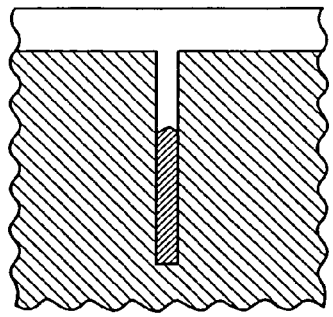
Figure 21F:
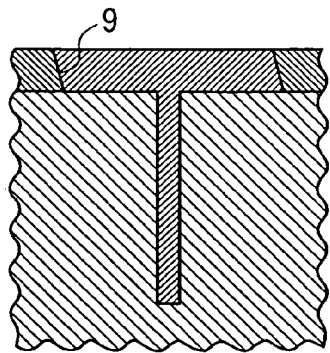

A third example of the crystalline silicon film formed by the process shown in FIGS. 17(a) to 17(g) will be explained with reference to FIG. 20.

First there is prepared, on a glass substrate 45, a silicon starting film in which a small region and a peripheral region are made in mutually different states under conditions same as in Example 4-1, and a photolithographic process is utilized to execute a patterning in a stripe shape of a width of 3 μm positioned on square lattice points and elongated in a direction, thereby preparing a patterned, stripe-shaped starting film 44 having current-supplying electrodes (not shown) on both ends of each stripe pattern.

Then, in order to melt and resolidify the stripe-shaped starting film 44, an AC current is supplied to the electrodes provided on both ends of the stripe pattern through electrode needles 42, thereby executing current heating to about 300° C. Then a KrF excimer laser light 41 of a pulse width of about 30 nsec is irradiated for melting and resolidifying of the starting film 44, to obtain a crystalline film. The energy density is regulated at a total pulse output capable of melting the starting film 36, in consideration of conditions such as an air temperature and a heat capacity of the glass substrate.

In an observation of the crystal grain shape constituting the obtained crystalline film, a circular single crystal grain reaching a diameter of about 3 μm grows at a pitch of 5 μm, while the periphery is filled with fine crystal grains of various sizes, having an average diameter of about 50 nm and being completely random in position, as in Example 4-1.

In the present Example, there is employed a starting film 44 in which the small region and the peripheral region are rendered mutually different by a silicon ion irradiation, and, as plural independent means for providing the starting film with energy, there are employed heating by a current heating of the starting film and a pulsed laser having an intensity change with time. The current heating means is means of an isothermal process without a change of the heating intensity with time in the melting step of the starting film, heating the film to a temperature not exceeding the melting point. The pulsed laser heating means is means having an athermal process showing a change of the heating intensity with time in the melting step of the starting film, thereby heating thus heated film to cause the melting thereof.

The invention claimed is:

1. A method for producing a crystalline film by melting and resolidifying a film comprising the steps of:
   preparing a film having a specific amorphous region obtained by a step of forming a film in which a specific amorphous region and a peripheral amorphous region continuous to a periphery of the specific amorphous region co-exist, the film having a thickness larger in the specific amorphous region than in the peripheral amorphous region;
   melting at least a part of the film so that a single crystal grain or a single cluster remains unmelted in the specific amorphous region; and
   resolidifying the film so that crystal growth occurs in a direction from the specific amorphous region toward the peripheral amorphous region.

2. The method according to claim 1, wherein the step of preparing a film includes a step of forming a concave portion on a surface of a substrate on which the film is provided.

3. The method according to claim 1, wherein, at a maximum melting state of the film in the melting-resolidification process, a single crystal grain or single crystalline cluster remains unmelted in the specific amorphous region while the peripheral amorphous region thereof is completely melted.

4. The method according to claim 3, wherein a ratio of a dimension to a thickness of the specific amorphous region is larger, when a crystal growth of the single crystal grain or the single crystalline cluster existing in the specific amorphous region executes a crystal growth in a resolidification step, than a ratio of a growth velocity in a planar direction to a growth velocity in a direction of film thickness in the specific amorphous region.

5. The method according to claim 3, wherein a ratio of a dimension to a thickness of the specific amorphous region is, when a crystal growth of the single crystal grain or the single crystalline cluster existing in the specific amorphous region executes a crystal growth in a resolidification step, within such a range that a growth front in a direction of film thickness reaches a surface of the film before a growth front in a planar direction of the film reaches a periphery of the specific amorphous region.

6. The method according to claim 3, wherein a ratio of a dimension of the specific amorphous region to a thickness difference between the specific amorphous region and the peripheral amorphous region is larger, when a crystal growth of the single crystal grain or single crystalline cluster existing in the specific amorphous region executes a crystal growth in a resolidification step, than a ratio of a growth velocity in a planar direction to a growth velocity in a direction of film thickness in the specific amorphous region.

7. The method according to claim 3, wherein a ratio of a dimension of the specific region to a thickness difference between the specific amorphous region and the peripheral amorphous region is larger, when a crystal growth of the single crystal grain or the single crystalline cluster existing in the specific amorphous region executes a crystal growth in a resolidification step, within such a range that a growth front in a direction of film thickness reaches a surface of the film before a growth front in a planar direction of the film reaches a periphery of the specific amorphous region.

8. The method according to claim 1, wherein a spatial position of at least a part of crystal grains having a continuous crystalline structure in the crystalline film is determined by a spatial position of the specific amorphous region.

9. The method according to claim 1, characterized in that, by defining a melting point of a bulk crystal as Tc and a supercooling degree causing a spontaneous nucleation from a molten phase as ΔTc in a melting-resolidification process of the film, the specific amorphous regions are provided with a predetermined interval such that a portion positioned between the specific amorphous regions of the predetermined interval reaches a temperature equal to or higher than Tc - ΔTc at a time when an unsolidified region reaches a supercooling degree of DTc at the resolidification of the film.

10. The method according to claim 9, wherein the specific amorphous regions are provided with a predetermined interval such that a portion where a region, in the vicinity of a growth front of a crystal grain growing from a specific amorphous region and having a higher temperature than in a periphery, overlaps with a region, in the vicinity of a growth front of a crystal grain growing from another specific amorphous region and having a higher temperature than in a periphery, has a temperature equal to or higher than Tc - ΔTc.

11. The method according to claim 10, wherein the specific amorphous regions are provided with a predetermined interval such that growth fronts of crystal grains growing from two specific amorphous regions mutually contact before a time when a portion where a high-temperature region, in the vicinity of a growth front of a crystal grain growing from a specific amorphous region, overlaps with a high-temperature region, in the vicinity of a growth front of a crystal grain growing from another specific region, reaches a temperature equal to or lower than Tc - ΔTc.

12. The method according to claim 1, characterized, in a melting-resolidification process of a film, in melting the film with plural heating means and resolidifying the film.

13. The method according to claim 12, wherein at least one of the plural heating means is heating means having a constant heating intensity without a change with time, in a melting process of the film.

14. The method according to claim 13, wherein the heating means having a constant heating intensity is a heat conduction from a substrate, an irradiation with a continuously oscillated laser light, or a current-supply heating of the film.

15. The method according to claim 12, wherein at least one of the plural heating means is heating means having a heating intensity changing with time, in a melting process of the film.

16. The method according to claim 15, wherein the heating means having a heating intensity changing with time is a pulsed laser irradiating the film with two pulses of different intensities with a time difference.

17. The method according to claim 12, wherein the plural heating means includes heating means having a constant heating intensity without a change with time in a melting process of the film, and heating means having a heating intensity changing with time in a melting process of the film.

18. The method according to claim 12, wherein the plural heating means includes heating means which heats the film to a temperature not exceeding a melting point, and heating means for heating the temperature-elevated film thereby melting the film.

19. The method according to claim 1, characterized in including a step of giving a heat not changing with time to the film thereby heating the film to a temperature not exceeding a melting point, a step of giving a heat changing with time thereby heating and melting the temperature-elevated film, and a step of resolidifying the film.

\* \* \* \* \*